US010615289B2

(12) United States Patent
Polishchuk et al.

(10) Patent No.: US 10,615,289 B2
(45) Date of Patent: Apr. 7, 2020

(54) NONVOLATILE CHARGE TRAP MEMORY DEVICE HAVING A HIGH DIELECTRIC CONSTANT BLOCKING REGION

(71) Applicant: LONGITUDE FLASH MEMORY SOLUTIONS LTD., Dublin (IE)

(72) Inventors: Igor Polishchuk, Fremont, CA (US); Sagy Charel Levy, Zichron Yaakov (IL); Krishnaswamy Ramkumar, San Jose, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 0 days.

(21) Appl. No.: 15/252,059

(22) Filed: Aug. 30, 2016

(65) Prior Publication Data
US 2017/0092781 A1    Mar. 30, 2017

Related U.S. Application Data

(60) Continuation of application No. 13/436,875, filed on Mar. 31, 2012, now Pat. No. 9,431,549, which is a
(Continued)

(51) Int. Cl.
*H01L 29/792* (2006.01)
*H01L 21/28* (2006.01)
(Continued)

(52) U.S. Cl.
CPC .......... *H01L 29/7923* (2013.01); *B82Y 10/00* (2013.01); *H01L 27/11578* (2013.01);
(Continued)

(58) Field of Classification Search
None
See application file for complete search history.

(56) References Cited

U.S. PATENT DOCUMENTS

| 4,395,438 A | 7/1983 | Chiang |
| 4,543,707 A | 10/1985 | Ito et al. |

(Continued)

FOREIGN PATENT DOCUMENTS

| CN | 101517714 A | 8/2009 |
| CN | 104254921 A | 12/2014 |

(Continued)

OTHER PUBLICATIONS

"Implementation of High K/Metal Gates in High Volume Manufacturing," Applied Materials, accessed from http://www.tel.uva.es/descargar.htm?id=6134 ; 5 pages.
(Continued)

*Primary Examiner* — Andres Munoz
(74) *Attorney, Agent, or Firm* — Kunzler Bean & Adamson

(57) ABSTRACT

An embodiment of a nonvolatile charge trap memory device is described. In one embodiment, the device comprises a channel comprising silicon overlying a surface on a substrate electrically connecting a first diffusion region and a second diffusion region of the memory device, and a gate stack intersecting and overlying at least a portion of the channel, the gate stack comprising a tunnel oxide abutting the channel, a split charge-trapping region abutting the tunnel oxide, and a multi-layer blocking dielectric abutting the split charge-trapping region. The split charge-trapping region includes a first charge-trapping layer comprising a nitride closer to the tunnel oxide, and a second charge-trapping layer comprising a nitride overlying the first charge-trapping layer. The multi-layer blocking dielectric comprises at least a high-K dielectric layer.

18 Claims, 15 Drawing Sheets

Related U.S. Application Data continuation-in-part of application No. 13/114,889, filed on May 24, 2011, now Pat. No. 8,860,122, which is a division of application No. 12/030,644, filed on Feb. 13, 2008, now abandoned.

(60) Provisional application No. 61/007,566, filed on Dec. 12, 2007.

(51) Int. Cl.

| | |
|---|---|
| *B82Y 10/00* | (2011.01) |
| *H01L 29/51* | (2006.01) |
| *H01L 29/66* | (2006.01) |
| *H01L 27/11578* | (2017.01) |
| *H01L 29/06* | (2006.01) |
| *H01L 29/423* | (2006.01) |
| *H01L 29/49* | (2006.01) |
| *H01L 29/786* | (2006.01) |

(52) U.S. Cl.
CPC .... *H01L 29/0676* (2013.01); *H01L 29/40117* (2019.08); *H01L 29/42392* (2013.01); *H01L 29/4908* (2013.01); *H01L 29/513* (2013.01); *H01L 29/517* (2013.01); *H01L 29/518* (2013.01); *H01L 29/66666* (2013.01); *H01L 29/66742* (2013.01); *H01L 29/66833* (2013.01); *H01L 29/78642* (2013.01); *H01L 29/78696* (2013.01); *H01L 29/792* (2013.01); *H01L 29/7926* (2013.01)

(56) References Cited

U.S. PATENT DOCUMENTS

| | | | |
|---|---|---|---|
| 4,667,217 A | 5/1987 | Janning | |
| 4,843,023 A | 6/1989 | Chiu et al. | |
| 5,404,791 A | 4/1995 | Kervagoret | |
| 5,405,791 A | 4/1995 | Ahmad et al. | |
| 5,573,963 A | 11/1996 | Sung | |
| 5,773,343 A | 6/1998 | Lee et al. | |
| 5,793,089 A | 8/1998 | Fulford et al. | |
| 5,817,170 A | 10/1998 | Desu et al. | |
| 5,847,411 A | 12/1998 | Morii | |
| 5,972,765 A | 10/1999 | Clark et al. | |
| 6,001,713 A | 12/1999 | Ramsbey et al. | |
| 6,015,739 A | 1/2000 | Gardner et al. | |
| 6,136,654 A | 10/2000 | Kraft et al. | |
| 6,153,543 A | 11/2000 | Chesire et al. | |
| 6,157,426 A | 12/2000 | Gu | |
| 6,214,689 B1 | 4/2001 | Lim et al. | |
| 6,218,700 B1 | 4/2001 | Papadas | |
| 6,297,096 B1 | 10/2001 | Boaz | |
| 6,321,134 B1 | 11/2001 | Henley et al. | |
| 6,365,518 B1 | 4/2002 | Lee et al. | |
| 6,429,081 B1 | 8/2002 | Doong et al. | |
| 6,433,383 B1 | 8/2002 | Ramsbey et al. | |
| 6,444,521 B1 | 9/2002 | Chang et al. | |
| 6,445,030 B1 | 9/2002 | Wu et al. | |
| 6,461,899 B1 | 10/2002 | Kitakado et al. | |
| 6,469,343 B1 | 10/2002 | Miura et al. | |
| 6,479,339 B2 | 11/2002 | Nandakumar et al. | |
| 6,518,113 B1 | 2/2003 | Buynoski | |
| 6,548,856 B1 | 4/2003 | Lin et al. | |
| 6,586,349 B1 | 7/2003 | Jeon et al. | |
| 6,596,590 B1 | 7/2003 | Miura et al. | |
| 6,610,614 B2 | 8/2003 | Niimi et al. | |
| 6,677,213 B1 | 1/2004 | Ramkumar et al. | |
| 6,709,928 B1 | 3/2004 | Jenne et al. | |
| 6,717,860 B1 | 4/2004 | Fujiwara | |
| 6,746,968 B1 | 6/2004 | Tseng et al. | |
| 6,768,856 B2 | 7/2004 | Akwani et al. | |
| 6,774,433 B2 | 8/2004 | Lee et al. | |
| 6,818,558 B1 | 11/2004 | Rathor et al. | |
| 6,833,582 B2 | 12/2004 | Mine et al. | |
| 6,835,621 B2 | 12/2004 | Yoo et al. | |
| 6,946,349 B1 | 9/2005 | Lee et al. | |
| 6,949,787 B2 | 9/2005 | Snyder et al. | |
| 6,958,511 B1 | 10/2005 | Halliyal et al. | |
| 7,018,868 B1 | 3/2006 | Yang et al. | |
| 7,033,957 B1 | 4/2006 | Shiraiwa et al. | |
| 7,060,594 B2 | 6/2006 | Wang | |
| 7,091,089 B2 | 8/2006 | Steimle | |
| 7,091,130 B1 | 8/2006 | Rao et al. | |
| 7,112,486 B2 | 9/2006 | Cho et al. | |
| 7,115,469 B1 | 10/2006 | Halliyal et al. | |
| 7,279,740 B2 | 10/2007 | Bhattacharyya et al. | |
| 7,315,474 B2 | 1/2008 | Lue | |
| 7,365,389 B1 | 4/2008 | Jeon et al. | |
| 7,390,718 B2 | 6/2008 | Roizin et al. | |
| 7,429,767 B2 | 9/2008 | Bhattacharyya | |
| 7,450,423 B2 | 11/2008 | Lai et al. | |
| 7,463,530 B2 | 12/2008 | Lue et al. | |
| 7,482,236 B2 | 1/2009 | Lee et al. | |
| 7,514,323 B2 | 4/2009 | Dobuzinsky et al. | |
| 7,576,386 B2 | 8/2009 | Lue et al. | |
| 7,642,585 B2 | 1/2010 | Wang et al. | |
| 7,646,041 B2 | 1/2010 | Chae et al. | |
| 7,651,915 B2 | 1/2010 | Yan et al. | |
| 7,670,963 B2 | 3/2010 | Ramkumar et al. | |
| 7,678,662 B2 | 3/2010 | Arghavani et al. | |
| 7,688,626 B2 | 3/2010 | Lue et al. | |
| 7,692,246 B2 | 4/2010 | Dreeskornfeld et al. | |
| 7,723,789 B2 | 5/2010 | Lin et al. | |
| 7,811,886 B2 | 10/2010 | Winstead et al. | |
| 7,811,887 B2 | 10/2010 | Irani et al. | |
| 7,816,728 B2 | 10/2010 | Ho et al. | |
| 7,927,951 B2 | 4/2011 | Kim et al. | |
| 7,948,799 B2 | 5/2011 | Lue et al. | |
| 7,972,929 B2 | 7/2011 | Lee | |
| 7,999,295 B2 | 8/2011 | Lai et al. | |
| 8,008,713 B2 | 8/2011 | Dobuzinsky et al. | |
| 8,063,434 B1 | 11/2011 | Polishchuk et al. | |
| 8,067,284 B1 | 11/2011 | Levy | |
| 8,071,453 B1 | 12/2011 | Ramkumar et al. | |
| 8,093,128 B2 | 1/2012 | Koutny et al. | |
| 8,120,095 B2 | 2/2012 | Ho et al. | |
| 8,143,129 B2 | 3/2012 | Ramkumar et al. | |
| 8,163,660 B2 | 4/2012 | Puchner et al. | |
| 8,222,688 B1 * | 7/2012 | Jenne | G11C 16/04 257/324 |
| 8,264,028 B2 | 9/2012 | Lue et al. | |
| 8,283,261 B2 | 10/2012 | Ramkumar | |
| 8,315,095 B2 | 11/2012 | Lue et al. | |
| 8,318,608 B2 | 11/2012 | Ramkumar et al. | |
| 8,482,052 B2 | 7/2013 | Lue et al. | |
| 8,614,124 B2 | 12/2013 | Jenne et al. | |
| 8,860,122 B1 | 10/2014 | Polishchuk et al. | |
| 9,299,568 B2 | 3/2016 | Jenne et al. | |
| 9,431,549 B2 * | 8/2016 | Polishchuk | H01L 29/792 |
| 2001/0052615 A1 | 12/2001 | Fujiwara | |
| 2002/0028541 A1 | 3/2002 | Lee et al. | |
| 2002/0141237 A1 | 10/2002 | Goda et al. | |
| 2002/0145159 A1 | 10/2002 | Ishii et al. | |
| 2002/0154878 A1 | 10/2002 | Akwani et al. | |
| 2003/0071302 A1 | 4/2003 | Hirotomo et al. | |
| 2003/0122204 A1 | 7/2003 | Nomoto et al. | |
| 2003/0123307 A1 | 7/2003 | Lee et al. | |
| 2003/0124873 A1 | 7/2003 | Xing et al. | |
| 2003/0183869 A1 | 10/2003 | Crivelli et al. | |
| 2003/0219947 A1 | 11/2003 | Shin et al. | |
| 2004/0094793 A1 | 5/2004 | Noguchi et al. | |
| 2004/0104424 A1 | 6/2004 | Yamazaki | |
| 2004/0110390 A1 | 6/2004 | Takagi et al. | |
| 2004/0119108 A1 | 6/2004 | Chang | |
| 2004/0129988 A1 | 7/2004 | Rotondaro et al. | |
| 2004/0173918 A1 | 9/2004 | Kamal et al. | |
| 2004/0183091 A1 | 9/2004 | Hibino | |
| 2004/0183122 A1 | 9/2004 | Mine et al. | |
| 2004/0207002 A1 | 10/2004 | Ryu et al. | |
| 2004/0227198 A1 | 11/2004 | Mitani et al. | |
| 2004/0251489 A1 | 12/2004 | Jeon et al. | |
| 2005/0026637 A1 | 2/2005 | Fischer et al. | |
| 2005/0056892 A1 | 3/2005 | Seliskar | |

(56) References Cited

U.S. PATENT DOCUMENTS

| | | | |
|---|---|---|---|
| 2005/0062098 A1* | 3/2005 | Mahajani | H01L 21/28185 257/324 |
| 2005/0070126 A1 | 3/2005 | Senzaki | |
| 2005/0093054 A1 | 5/2005 | Jung | |
| 2005/0098839 A1 | 5/2005 | Lee et al. | |
| 2005/0110102 A1 | 5/2005 | Wang et al. | |
| 2005/0116279 A1 | 6/2005 | Koh | |
| 2005/0141168 A1 | 6/2005 | Lee et al. | |
| 2005/0186741 A1 | 8/2005 | Roizin et al. | |
| 2005/0205920 A1 | 9/2005 | Jeon et al. | |
| 2005/0227501 A1 | 10/2005 | Tanabe et al. | |
| 2005/0236679 A1 | 10/2005 | Hori et al. | |
| 2005/0245034 A1 | 11/2005 | Fukuda et al. | |
| 2005/0266637 A1 | 12/2005 | Wang | |
| 2005/0275010 A1 | 12/2005 | Chen et al. | |
| 2005/0275012 A1 | 12/2005 | Nara et al. | |
| 2006/0017092 A1 | 1/2006 | Dong et al. | |
| 2006/0035432 A1 | 2/2006 | Kim et al. | |
| 2006/0051880 A1 | 3/2006 | Doczy et al. | |
| 2006/0065919 A1 | 3/2006 | Fujiwara | |
| 2006/0081331 A1 | 4/2006 | Campian | |
| 2006/0111805 A1 | 5/2006 | Yokoyama et al. | |
| 2006/0113586 A1 | 6/2006 | Wang | |
| 2006/0113605 A1 | 6/2006 | Currie | |
| 2006/0113627 A1 | 6/2006 | Chen et al. | |
| 2006/0192248 A1 | 8/2006 | Wang | |
| 2006/0202261 A1 | 9/2006 | Lue et al. | |
| 2006/0220106 A1 | 10/2006 | Choi et al. | |
| 2006/0228899 A1 | 10/2006 | Nansei et al. | |
| 2006/0228907 A1 | 10/2006 | Cheng et al. | |
| 2006/0261401 A1 | 11/2006 | Bhattacharyya | |
| 2006/0281331 A1 | 12/2006 | Wang | |
| 2006/0284236 A1 | 12/2006 | Bhattacharyya | |
| 2006/0292781 A1 | 12/2006 | Lee | |
| 2007/0012988 A1 | 1/2007 | Bhattacharyya | |
| 2007/0018201 A1 | 1/2007 | Specht et al. | |
| 2007/0048916 A1 | 3/2007 | Suzuki et al. | |
| 2007/0051306 A1 | 3/2007 | Ivanov et al. | |
| 2007/0066087 A1 | 3/2007 | Jung | |
| 2007/0087503 A1 | 4/2007 | Lusky | |
| 2007/0108497 A1 | 5/2007 | Shih et al. | |
| 2007/0121380 A1 | 5/2007 | Thomas | |
| 2007/0132054 A1 | 6/2007 | Arghavani et al. | |
| 2007/0210371 A1 | 8/2007 | Hisamoto et al. | |
| 2007/0215940 A1 | 9/2007 | Ligon | |
| 2007/0272971 A1 | 11/2007 | Lee et al. | |
| 2008/0029399 A1 | 2/2008 | Tomita et al. | |
| 2008/0032475 A1 | 2/2008 | Joshi et al. | |
| 2008/0048237 A1 | 2/2008 | Iwata | |
| 2008/0087942 A1 | 4/2008 | Hsu et al. | |
| 2008/0090350 A1 | 4/2008 | Yan et al. | |
| 2008/0121983 A1 | 5/2008 | Seong et al. | |
| 2008/0146042 A1 | 6/2008 | Kostamo et al. | |
| 2008/0150003 A1 | 6/2008 | Chen et al. | |
| 2008/0173928 A1 | 7/2008 | Arai et al. | |
| 2008/0175053 A1 | 7/2008 | Lue et al. | |
| 2008/0237684 A1 | 10/2008 | Specht et al. | |
| 2008/0237694 A1 | 10/2008 | Specht et al. | |
| 2008/0258203 A1 | 10/2008 | Happ et al. | |
| 2008/0272424 A1 | 11/2008 | Kim et al. | |
| 2008/0290398 A1 | 11/2008 | Polishchuk et al. | |
| 2008/0290399 A1* | 11/2008 | Levy | H01L 21/28282 257/324 |
| 2008/0290400 A1 | 11/2008 | Jenne et al. | |
| 2008/0291726 A1 | 11/2008 | Lue et al. | |
| 2008/0293207 A1 | 11/2008 | Koutny et al. | |
| 2008/0293254 A1 | 11/2008 | Ramkumar et al. | |
| 2008/0293255 A1 | 11/2008 | Ramkumar | |
| 2008/0296661 A1 | 12/2008 | Ramkumar et al. | |
| 2008/0296664 A1 | 12/2008 | Ramkumar et al. | |
| 2008/0296693 A1 | 12/2008 | Richter et al. | |
| 2009/0001352 A1* | 1/2009 | Han | H01L 21/28273 257/24 |
| 2009/0011609 A1 | 1/2009 | Ramkumar et al. | |
| 2009/0032863 A1 | 2/2009 | Levy et al. | |
| 2009/0039414 A1 | 2/2009 | Lue et al. | |
| 2009/0045452 A1 | 2/2009 | Lue et al. | |
| 2009/0057752 A1 | 3/2009 | Wang et al. | |
| 2009/0061572 A1 | 3/2009 | Hareland et al. | |
| 2009/0078990 A1* | 3/2009 | Yasuda | H01L 21/28282 257/326 |
| 2009/0086548 A1 | 4/2009 | Wu et al. | |
| 2009/0104780 A1 | 4/2009 | Lee | |
| 2009/0152621 A1 | 6/2009 | Polishchuk et al. | |
| 2009/0179253 A1 | 7/2009 | Levy et al. | |
| 2009/0179254 A1 | 7/2009 | Schaijk et al. | |
| 2009/0181530 A1 | 7/2009 | Lisiansky et al. | |
| 2009/0206385 A1 | 8/2009 | Kim et al. | |
| 2009/0227116 A1 | 9/2009 | Joo et al. | |
| 2010/0112769 A1 | 5/2010 | Son et al. | |
| 2010/0117139 A1 | 5/2010 | Lue | |
| 2010/0140684 A1 | 6/2010 | Ozawa | |
| 2010/0155823 A1 | 6/2010 | Lue et al. | |
| 2010/0200908 A1 | 8/2010 | Lee et al. | |
| 2010/0252877 A1 | 10/2010 | Nakanishi et al. | |
| 2010/0276667 A1 | 11/2010 | Kim et al. | |
| 2011/0018053 A1 | 1/2011 | Lo et al. | |
| 2011/0163371 A1 | 7/2011 | Song et al. | |
| 2011/0248332 A1 | 10/2011 | Levy et al. | |
| 2011/0275182 A1 | 11/2011 | Mouli | |
| 2012/0037977 A1 | 2/2012 | Lee et al. | |
| 2012/0068159 A1 | 3/2012 | Fujiki et al. | |
| 2012/0068242 A1 | 3/2012 | Shin et al. | |
| 2013/0175599 A1* | 7/2013 | Yang | H01L 22/14 257/324 |
| 2013/0175600 A1* | 7/2013 | Jenne | H01L 21/28282 257/324 |
| 2013/0175604 A1 | 7/2013 | Polishchuk et al. | |
| 2016/0300959 A1 | 10/2016 | Jenne et al. | |

FOREIGN PATENT DOCUMENTS

| | | |
|---|---|---|
| KR | 20040070669 A | 8/2004 |
| TW | 200703671 A | 1/2007 |
| WO | 2011162725 A1 | 12/2011 |

OTHER PUBLICATIONS

Jeong-Mo Hwang, "Bringing Non-Volatile Memory Blocks to SOCs Using the SONOS Process", Simtek Corporation; 11 pages.

SIPO Office Action for International Application No. 2013800325454 dated Aug. 10, 2017; 8 pages.

USPTO Non-Final Rejection for U.S. Appl. No. 15/051,279 dated Sep. 27, 2017; 7 pages.

USPTO Requirement for Restriction for U.S. Appl. No. 11/904,506 dated Apr. 13, 2010; 7 pages.

USPTO Requirement for Restriction for U.S. Appl. No. 11/904,513 dated Oct. 7, 2008; 8 pages.

USPTO Notice of Allowance for U.S. Appl. No. 15/051,279 dated Feb. 14, 2018; 9 pages.

SIPO Office Action for International Application No. 201380032545.4 dated Feb. 23, 2018; 7 pages.

Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.

International Search Report for International Application No. PCT/US07/20966 dated Apr. 21, 2008; 1 page.

International Search Report for International Application No. PCT/US07/20988 dated Mar. 14, 2008; 2 pages.

International Search Report for International Application No. PCT/US2013/048874 dated Dec. 16, 2013; 2 pages.

Lue et al., "BE-SONOS: A Bandgap Engineered SONOS with Excellent Performance and Reliability," IEEE, 2005; 4 pages.

Lue, Hang-Ting et al., "Reliability Model of Bandgap Engineered SONOS (be-SONOS)", IEEE, 2006, 4 pgs.

SIPO Office Action for Application No. 200780035963.3 dated Feb. 29, 2012; 4 pages.

SIPO Office Action for Chinese Application No. 200780037848.X dated Jan. 30, 2012; 6 pages.

(56) References Cited

OTHER PUBLICATIONS

SIPO Office Action for Chinese Application No. 200780037848.X dated Nov. 12, 2010; 2 pages.
SIPO Office Action for International Application No. 2013800325454 dated Dec. 2, 2016; 5 pages.
TIPO Office Action for Application No. 111203859-TW dated Aug. 23, 2013; 6 pages.
TIPO Office Action for International Application No. 102110453 dated Feb. 9, 2017; 12 pages.
TIPO Office Action for Taiwan Application No. 096136689.0 dated Feb. 21, 2014; 2 pages.
TIPO Office Action for Taiwan Application No. 096136689.0 dated Aug. 9, 2013; 5 pages.
USPTO Advisory Action for U.S. Appl. No. 11/904,506 dated Aug. 30, 2011; 4 pages.
USPTO Final Rejection for U.S. Appl. No. 11/904,513 dated Jun. 24, 2009; 12 pages.
USPTO Final Rejection for U.S. Appl. No. 11/904,506 dated Jun. 7, 2011; 15 pages.
USPTO Final Rejection for U.S. Appl. No. 13/539,461 dated Jun. 4, 2015; 9 pages.
USPTO Final Rejection for U.S. Appl. No. 15/051,279 dated Feb. 9, 2017; 8 pages.
USPTO Non Final Rejection for U.S. Appl. No. 11/904,506 dated Feb. 3, 2011; 13 pages.
USPTO Non Final Rejection for U.S. Appl. No. 11/904,506 dated Aug. 31, 2010; 17 pages.
USPTO Non Final Rejection For U.S. Appl. No. 11/904,513 dated Dec. 10, 2008; 11 pages.
USPTO Non-Final Rejection for U.S. Appl. No. 13/539,461 dated Jan. 2, 2015; 14 pages.
USPTO Non-Final Rejection for U.S. Appl. No. 15/051,279 dated Dec. 30, 2016; 9 pages.
USPTO Notice of Allowance for U.S. Appl. No. 11/904,506 dated Sep. 16, 2013; 8 pages.
USPTO Notice of Allowance for U.S. Appl. No. 11/904,506 dated Oct. 28, 2013; 9 pages.
USPTO Notice of Allowance for U.S. Appl. No. 11/904,513 dated Oct. 9, 2009; 7 pages.
USPTO Notice of Allowance for U.S. Appl. No. 13/539,461 dated Aug. 13, 2015; 7 pages.
USPTO Notice of Allowance for U.S. Appl. No. 13/539,461 dated Nov. 24, 2015; 7 pages.
Wang, Szu-Yu et al., "Reliability and processing effects of bandgap engineered SONOS flash memory", 2007 IEEE, International Reliability Symposium, Apr. 18, 2007, 5 pgs.
Written Opinion of the International Searching Authority for International Application No. PCT/US07/20966 dated Apr. 21, 2008; 5 pages.
Written Opinion of the International Searching Authority for International Application No. PCT/US07/20988 dated Mar. 14, 2008; 6 page.
Written Opinion of the International Searching Authority for International Application No. PCT/US2013/048874 dated Dec. 16, 2013; 7 pages.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.
Hung et al., High-performance gate-all-around polycrystalline silicon nanowire with silicon nanocrystals nonvolatile memory, Appl. Phys. Lett, 98 162108 (2011), pub date: Apr. 22, 2011.
Sun, Y., et al., "Multibit Programmable Flash Memory Realized on Vertical Si Nanowire Channel", IEEE Electron Device Letters, IEEE, vol. 31, Issue 5, May 2010.
TIPO Office Action for International Application No. 102110453 dated Oct. 21, 2016; 20 pages.
USPTO Advisory Action for U.S. Appl. No. 13/114,889 dated May 6, 2014; 3 pages.
USPTO Advisory Action for U.S. Appl. No. 13/114,889 dated Aug. 2, 2013; 2 pages.
USPTO Advisory Action for U.S. Appl. No. 13/114,889 dated Aug. 29, 2012; 3 pages.
USPTO Advisory Action for U.S. Appl. No. 13/436,875 dated Sep. 17, 2015; 3 pages.
USPTO Advisory Action for U.S. Appl. No. 13/436,875 dated Oct. 24, 2014; 3 pages.
USPTO Final Rejection for U.S. Appl. No. 12/030,644 dated Jan. 24, 2011; 22 pages.
USPTO Final Rejection for U.S. Appl. No. 13/114,889 dated Feb. 11, 2014; 17 pages.
USPTO Final Rejection for U.S. Appl. No. 13/114,889 dated Apr. 2, 2013; 12 pages.
USPTO Final Rejection for U.S. Appl. No. 13/114,889 dated Jun. 4, 2012; 12 pages.
USPTO Final Rejection for U.S. Appl. No. 13/436,875 dated Jun. 23, 2015; 21 pages.
USPTO Final Rejection for U.S. Appl. No. 13/436,875 dated Aug. 8, 2014; 12 pages.
USPTO Miscellaneous Internal Document for U.S. Appl. No. 12/030,644 dated May 28, 2010; 6 pages.
USPTO Non Final Rejection for U.S. Appl. No. 13/114,889 dated Sep. 5, 2013; 11 pages.
USPTO Non Final Rejection for U.S. Appl. No. 13/114,889 dated Nov. 25, 2011; 13 pages.
USPTO Non-Final Rejection for U.S. Appl. No. 12/030,644 dated May 28, 2010; 19 pages.
USPTO Non-Final Rejection for U.S. Appl. No. 13/114,889 dated Oct. 10, 2012; 11 pages.
USPTO Non-Final Rejection for U.S. Appl. No. 13/436,875 dated Jan. 15, 2015; 21 pages.
USPTO Non-Final Rejection for U.S. Appl. No. 13/436,875 dated Feb. 21, 2014; 14 pages.
USPTO Non-Final Rejection for U.S. Appl. No. 13/436,875 dated Oct. 5, 2015; 19 pages.
USPTO Notice of Allowance for U.S. Appl. No. 13/114,889 dated Jun. 19, 2014; 9 pages.
USPTO Notice of Allowance for U.S. Appl. No. 13/436,875 dated Jan. 5, 2016; 5 pages.
USPTO Notice of Allowance for U.S. Appl. No. 13/436,875 dated Apr. 22, 2016; 8 pages.
USPTO Requirement for Restriction for U.S. Appl. No. 12/030,644 dated Oct. 7, 2009; 11 pages.
USPTO Requirement for Restriction for U.S. Appl. No. 13/114,889 dated Sep. 7, 2011; 6 pages.
USPTO Requirement for Restriction for U.S. Appl. No. 13/436,875 dated Oct. 18, 2013; 8 pages.
TIPO Office Action for International Application No. 102123446 dated Mar. 10, 2017; 11 pages.
SIPO Office Action for International Application No. 201380032545.4 dated Nov. 12, 2018; 6 pages.
Korean Intellectual Property Office Office Action for international application 10-2014-7035194 dated Mar. 28, 2019, 9 pages.

\* cited by examiner

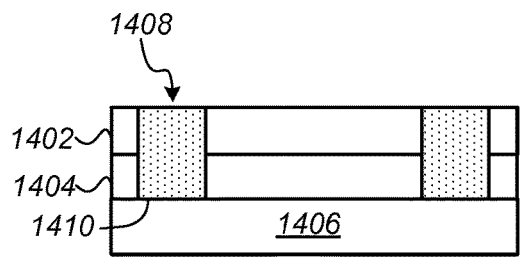
FIG. 14A
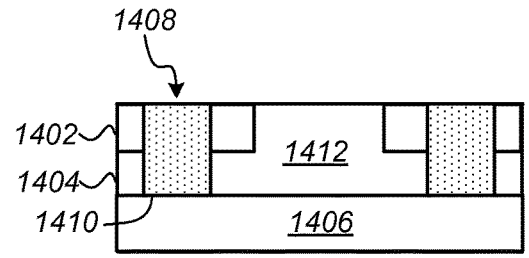
FIG. 14B
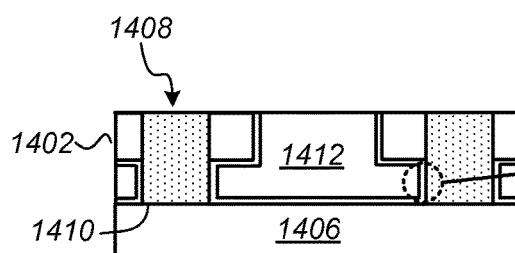
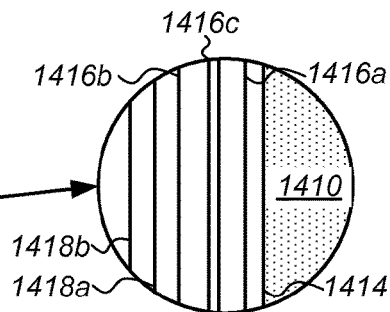
FIG. 14C
FIG. 14D
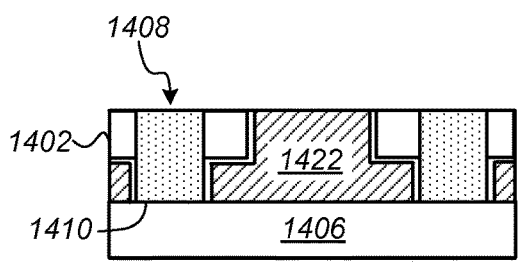
FIG. 14E
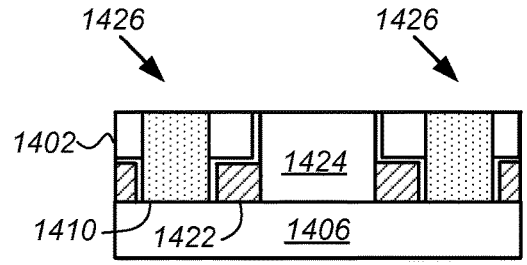
FIG. 14F

NONVOLATILE CHARGE TRAP MEMORY DEVICE HAVING A HIGH DIELECTRIC CONSTANT BLOCKING REGION

CROSS-REFERENCE TO RELATED APPLICATIONS

This application is a continuation of application Ser. No. 13/436,875, filed Mar. 31, 2012, Now U.S. Pat. No. 9,431,549, Issued Aug. 30, 2016, which is a continuation-in-part of U.S. application Ser. No. 13/114,889, filed May 24, 2011, Now U.S. Pat. No. 8,860,122, Issued Oct. 14, 2014, which is a divisional application of U.S. patent application Ser. No. 12/030,644, filed Feb. 13, 2008, Now abandoned, which claims the benefit of U.S. Provisional Application No. 61/007,566, filed Dec. 12, 2007, the entire contents of which are hereby incorporated by reference herein

TECHNICAL FIELD

The invention is in the field of semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile semiconductor memories typically use stacked floating gate type field-effect-transistors. In such transistors, electrons are injected into a floating gate of a memory cell to be programmed by biasing a control gate and grounding a body region of a substrate on which the memory cell is formed. An oxide-nitride-oxide (ONO) stack is used as either a charge storing layer, as in a semiconductor-oxide-nitride-oxide-semiconductor (SON OS) transistor, or as an isolation layer between the floating gate and control gate, as in a split gate flash transistor. FIG. 1 illustrates a cross-sectional view of a conventional nonvolatile charge trap memory device.

Referring to FIG. 1, semiconductor device 100 includes a SO NOS gate stack 104 including a conventional ONO portion 106 formed over a silicon substrate 102. Semiconductor device 100 further includes source and drain regions 110 on either side of SONOS gate stack 104 to define a channel region 112. SONOS gate stack 104 includes a poly-silicon gate layer 108 formed above and in contact with ONO portion 106. Polysilicon gate layer 108 is electrically isolated from silicon substrate 102 by ONO portion 106. ONO portion 106 typically includes a tunnel oxide layer 106A, a nitride or oxynitride charge-trapping layer 106B, and a top oxide layer 106C overlying nitride or oxynitride layer 106B.

One problem with conventional SONOS transistors is the limited program and erase window achievable with a conventional blocking layer 106C, inhibiting optimization of semiconductor device 100. For example, FIG. 2 is a plot 200 of Threshold Voltage (V) as a function of Pulse Width (s) in erase mode for a conventional nonvolatile charge trap memory device. Referring to FIG. 2, line 202 is a measure of decreasing threshold voltage (in Volts) as a function of time (in seconds) in response to an erase-mode voltage being applied to a gate electrode in a conventional SONOS transistor. As indicated by region 204 of line 202, the ability of the erase mode to decrease the threshold voltage of the gate electrode saturates with time, restricting an erase event to a relatively shallow erase of the gate electrode. The shallow erase limits the differential between erase and program modes for a SONGS-transistor and thus limits the performance of such a device.

BRIEF DESCRIPTION OF THE DRAWINGS

Embodiments of the present invention are illustrated by way of example, and not limitation, in the figures of the accompanying drawings in which:

FIG. 13A through 13G illustrate a gate first scheme for fabricating the non-planar multigate device of FIG. 12A.

FIG. 14A through 14F illustrate a gate last scheme for fabricating the non-planar multigate device of FIG. 12A.

DETAILED DESCRIPTION

A nonvolatile charge trap memory device and a method to form the same is described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein is a nonvolatile charge trap memory device. The device may include a substrate having a channel region and a pair of source and drain regions. A gate stack may be formed above the substrate over the channel region and between the pair of source and drain regions. In an embodiment, the gate stack includes a high dielectric constant blocking region. In one embodiment, the high dielectric constant blocking region is a bi-layer blocking dielectric region having a first dielectric layer disposed directly above a charge-trapping layer and a second dielectric layer disposed directly above the first dielectric layer and directly below a gate layer. The dielectric constant of the first dielectric layer is lower than the dielectric constant of the second dielectric layer. In another embodiment, the high dielectric constant blocking region is a graded blocking dielectric layer disposed directly above a charge-trapping layer and directly below a gate layer. The dielectric constant of the graded blocking dielectric layer has a low-to-high gradient in the direction from the charge-trapping layer to the gate layer.

Figure 1:
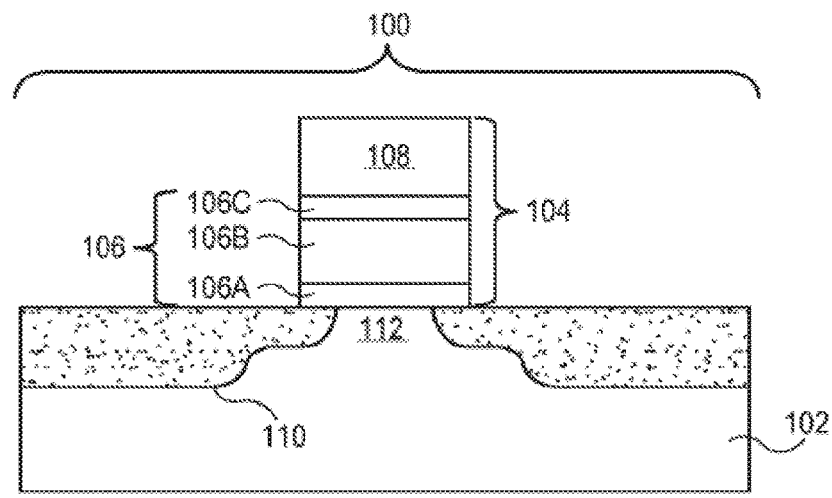
FIG. 1 (Prior Art) illustrates a cross-sectional view of a conventional nonvolatile charge trap memory device.
Figure 2:
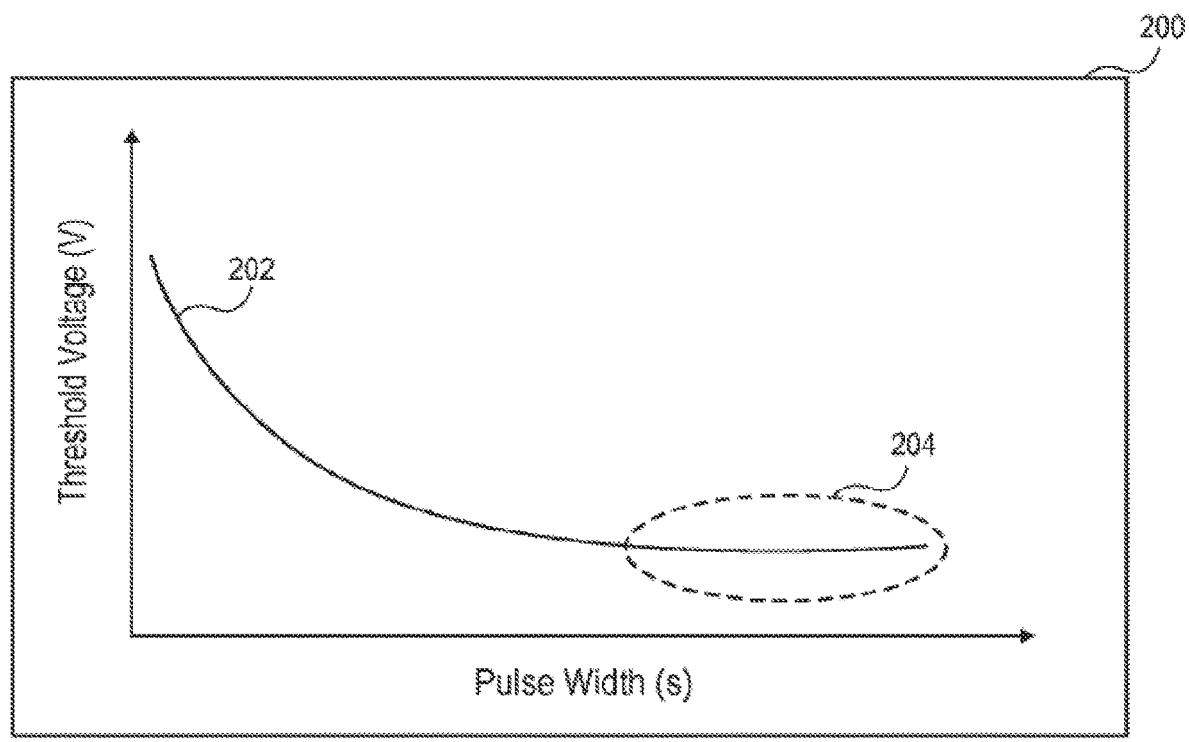
FIG. 2 (Prior Art) is a plot of Threshold Voltage (V) as a function of Pulse Width (s) in erase mode for a conventional nonvolatile charge trap memory device.
Figure 3:
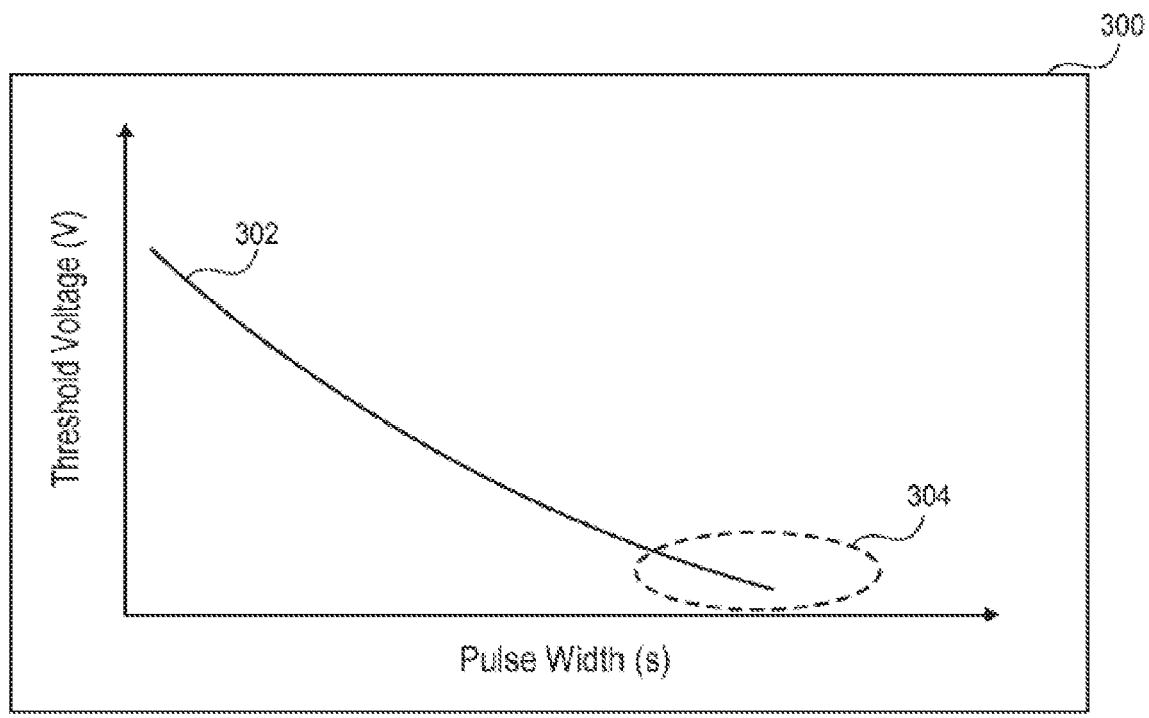
FIG. 3 is a plot of Threshold Voltage (V) as a function of Pulse Width (s) in erase mode for a nonvolatile charge trap memory device having a high dielectric constant blocking region, in accordance with an embodiment of the present invention.

A nonvolatile charge trap memory device including a high dielectric constant blocking region may exhibit a relatively large program and erase window, enabling improved performance of such a device. For example, in accordance with an embodiment of the present invention, FIG. 3 is a plot 300 of Threshold Voltage (V) as a function of Pulse Width (s) in erase mode for a nonvolatile charge trap memory device having a high dielectric constant blocking region. Referring to FIG. 3, line 302 is a measure of decreasing threshold voltage (in Volts) as a function of time (in seconds) in response to an erase-mode voltage being applied to a gate electrode in a nonvolatile charge trap memory transistor. As indicated by region 304 of line 302, the ability of the erase mode to decrease the threshold voltage of the gate electrode does not substantially saturate with time, allowing for a relatively deep erase of the gate electrode. In one embodiment, the deep erase enables a greater differential between erase and program modes for a nonvolatile charge trap memory transistor.

Figure 4:
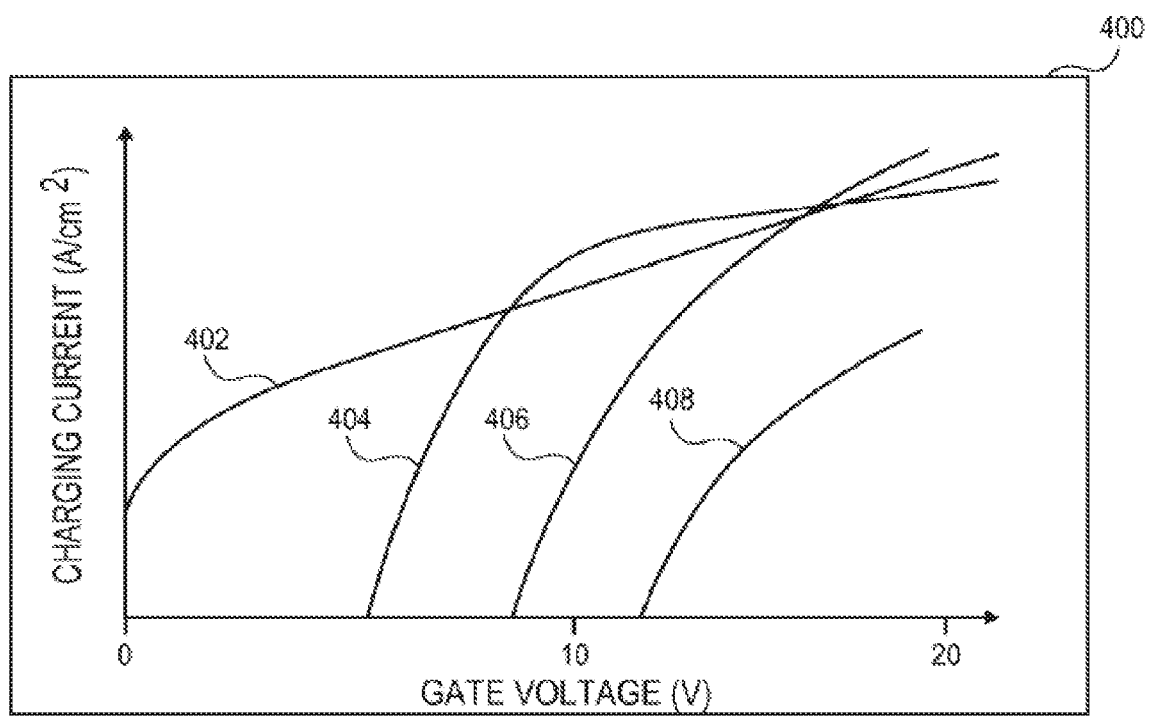
FIG. 4 is a plot of Charging Current (A/cm2) as a function of Gate Voltage (V) for four different nonvolatile charge trap memory devices, in accordance with an embodiment of the present invention.

The ability to achieve a deep erase in a nonvolatile charge trap memory device including a high dielectric constant blocking region may result from the ability of the high dielectric constant blocking region to mitigate back-streaming of electrons. Such back-streaming otherwise proceeds into a charge-trapping layer that is subject to an erase-mode voltage application. For example, in accordance with an embodiment of the present invention, FIG. 4 is a plot 400 of Charging Current (A/cm2) as a function of Gate Voltage (V) for four different nonvolatile charge trap memory devices. Referring to FIG. 4, lines 402, 404, 406 and 408 are measures of increasing charging current ("backstreaming" in Amperes per square centimeter) as a function of gate voltage (in Volts) in response to an erase-mode voltage being applied to gate electrodes in a series of four nonvolatile charge trap memory transistors, respectively. Lines 402, 404, 406 and 408 represent data obtained from nonvolatile charge trap memory transistors having progressively physically thicker blocking dielectric layers, respectively, but all having approximately the same equivalent oxide thickness (EOT), i.e. the same electrical thickness. In one embodiment, the amount of gate voltage required to produce a significant back-streaming event increases with increasing physical thickness of the blocking dielectric layer, as depicted in FIG. 4. Thus, in a specific embodiment, the higher the dielectric constant of the blocking dielectric layer, the less back-streaming observed at a given voltage and at a given electrical thickness. In comparison with a conventional memory device, the reduction in back-streaming may enable a greater program and erase window, improving the performance of a nonvolatile charge trap memory device at a given electrical thickness. However, the same effect may be exploited to scale down the electrical parameters of a nonvolatile charge trap memory device. For example, in accordance with an alternative embodiment of the present invention, a high dielectric constant blocking region has a smaller EOT than the blocking layer of a conventional memory device. In a specific alternative embodiment, a high dielectric constant blocking region has a smaller EOT than the blocking layer of a conventional memory device, and a nonvolatile charge trap memory device incorporating the high dielectric constant blocking region is operated at a lower gate voltage than the gate voltage used for the conventional memory device.

Figure 5:
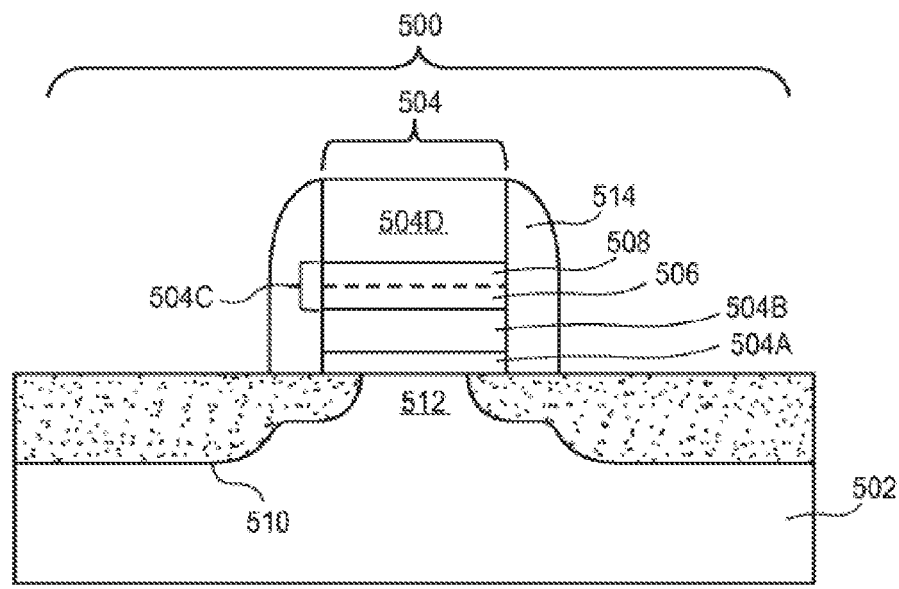
FIG. 5 illustrates a cross-sectional view of a nonvolatile charge trap memory device having a multi-layer high dielectric constant blocking region, in accordance with an embodiment of the present invention.

A nonvolatile charge trap memory device may include a multi-layer blocking dielectric region. FIG. 5 illustrates a cross-sectional view of a nonvolatile charge trap memory device having a multi-layer high dielectric constant blocking region, in accordance with an embodiment of the present invention.

Referring to FIG. 5, semiconductor device 500 includes a gate stack 504 formed over a substrate 502. Semiconductor device 500 further includes source and drain regions 510 in substrate 502 on either side of gate stack 504, defining a channel region 512 in substrate 502 underneath gate stack 504. Gate stack 504 includes a tunnel dielectric layer 504A, a charge-trapping layer 504B, a multi-layer blocking dielectric region 504C, and a gate layer 504D. Thus, gate layer 504D is electrically isolated from substrate 502. Multi-layer blocking dielectric region 504C includes a first dielectric layer 506 disposed above charge-trapping layer 504B and a second dielectric layer 508 disposed above first dielectric layer 506 and below gate layer 504D. A pair of dielectric spacers 514 isolates the sidewalls of gate stack 504.

Semiconductor device 500 may be any nonvolatile charge trap memory device. In one embodiment, semiconductor device 500 is a Flash-type device wherein the charge-trapping layer is a conductor layer or a semiconductor layer. In accordance with another embodiment of the present invention, semiconductor device 500 is a SONOS-type device wherein the charge-trapping layer is an insulator layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the blocking dielectric layer and the second "Semiconductor" refers to the gate layer. A SONOS-type device, however, is not limited to these specific materials, as described below.

Substrate 502 and, hence, channel region 512, may be composed of any material suitable for semiconductor device fabrication. In one embodiment, substrate 502 is a bulk substrate composed of a single crystal of a material which may include, but is not limited to, silicon, germanium, silicon-germanium or a III-V compound semiconductor material. In another embodiment, substrate 502 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 502 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and an III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, an III-V compound semiconductor material and quartz. Substrate 502 and, hence, channel region 512, may include dopant impurity atoms. In a specific embodiment, channel region 512 is doped P-type and, in an alternative embodiment, channel region 512 is doped N-type.

Source and drain regions 510 in substrate 502 may be any regions having opposite conductivity to channel region 512. For example, in accordance with an embodiment of the present invention, source and drain regions 510 are N-type doped regions while channel region 512 is a P-type doped region. In one embodiment, substrate 502 and, hence, channel region 512, is composed of boron-doped single-crystal silicon having a boron concentration in the range of $1\times10^{15}$-$1\times10^{19}$ atoms/cm$^3$. Source and drain regions 510 are composed of phosphorous- or arsenic-doped regions having a concentration of N-type dopants in the range of $5\times10^{16}$-$5\times10^{19}$ atoms/cm$^3$. In a specific embodiment, source and drain regions 510 have a depth in substrate 502 in the range of 80-200 nanometers. In accordance with an alternative embodiment of the present invention, source and drain regions 510 are P-type doped regions while channel region 512 is an N-type doped region.

Tunnel dielectric layer 504A may be any material and have any thickness suitable to allow charge carriers to tunnel into the charge-trapping layer under an applied gate bias while maintaining a suitable barrier to leakage when the device is unbiased. In one embodiment, tunnel dielectric layer 504A is formed by a thermal oxidation process and is composed of silicon dioxide or silicon oxy-nitride, or a combination thereof. In another embodiment, tunnel dielectric layer 504A is formed by chemical vapor deposition or atomic layer deposition and is composed of a dielectric layer which may include, but is not limited to, silicon nitride, aluminum oxide, hafnium oxide, zirconium oxide, hafnium silicate, zirconium silicate, hafnium oxy-nitride, hafnium zirconium oxide and lanthanum oxide. In another embodiment, tunnel dielectric layer 504A is a bi-layer dielectric region including a bottom layer of a material such as, but not limited to, silicon dioxide or silicon oxy-nitride and a top layer of a material which may include, but is not limited to, silicon nitride, aluminum oxide, hafnium oxide, zirconium oxide, hafnium silicate, zirconium silicate, hafnium oxy-nitride, hafnium zirconium oxide and lanthanum oxide. Thus, in one embodiment, tunnel dielectric layer 504A includes a high-K dielectric portion. In a specific embodiment, tunnel dielectric layer 504A has a thickness in the range of 1-10 nanometers.

Charge-trapping layer may be any material and have any thickness suitable to store charge and, hence, raise the threshold voltage of gate stack 504. In accordance with an embodiment of the present invention, charge-trapping layer 504B is formed by a chemical vapor deposition process and is composed of a dielectric material which may include, but is not limited to, stoichiometric silicon nitride, silicon-rich silicon nitride and silicon oxy-nitride. In one embodiment, charge-trapping layer 504B is composed of a bi-layer silicon oxy-nitride region. For example, in a specific embodiment, charge-trapping layer 504B includes an oxygen-rich portion and a silicon rich portion and is formed by depositing an oxygen-rich oxy-nitride film by a first composition of gases and, subsequently, depositing a silicon-rich oxy-nitride film by a second composition of gases. In a particular embodiment, charge-trapping layer 504B is formed by modifying the flow rate of ammonia (NH3) gas, and introducing nitrous oxide (N20) and dichlorosilane (SiH2Cb) to provide the desired gas ratios to yield first an oxygen-rich oxy-nitride film and then a silicon-rich oxy-nitride film. In one embodiment, charge-trapping layer 504B has a thickness in the range of 5-10 nanometers. In accordance with an alternative embodiment of the present invention, charge-trapping layer 504B has a graded composition.

Multi-layer blocking dielectric region 504C may be composed of any material and have any thickness suitable to maintain a barrier to charge leakage without significantly decreasing the capacitance of gate stack 504. In accordance with an embodiment of the present invention, multi-layer blocking dielectric region 504C is a bilayer blocking dielectric region having a first dielectric layer 506 disposed directly above charge-trapping layer 504B and having a second dielectric layer 508 disposed directly above first dielectric layer 506 and directly below gate layer 504D. In an embodiment, first dielectric layer 506 has a large barrier height while second dielectric layer 508 has a high dielectric constant. In one embodiment, the barrier height of first dielectric layer 506 is at least approximately 2 electron Volts (eV). In a specific embodiment, the barrier height of first dielectric layer 506 is at least approximately 3 eV. In an embodiment, the dielectric constant of first dielectric layer 506 is lower than the dielectric constant of second dielectric layer 508. In one embodiment, first dielectric layer 506 of bi-layer blocking dielectric region 504C is composed of silicon dioxide and second dielectric layer 508 is composed of silicon nitride. In another embodiment, first dielectric layer 506 of bi-layer blocking dielectric region 504C is composed of silicon dioxide and second dielectric layer 508 is composed of a material such as, but not limited to, aluminum oxide, hafnium oxide, zirconium oxide, hafnium silicate, zirconium silicate, hafnium oxy-nitride, hafnium zirconium oxide or lanthanum oxide. In a specific embodiment, first dielectric layer 506 of bi-layer blocking dielectric region 504C is composed of a material having a dielectric constant approximately in the range of 3.5-4.5 and second dielectric layer 508 is composed of a material having a dielectric constant above approximately 7. In accordance with an embodiment of the present invention, multi-layer blocking dielectric region 504C is formed in part by a chemical vapor deposition process. In one embodiment, multi-layer blocking dielectric region 504C is formed from at least two different materials. In a specific embodiment, forming multi-layer blocking dielectric region 504C from at least two different materials includes oxidizing a top portion of charge-trapping layer 504B and, subsequently, depositing a dielectric layer above the oxidized portion of charge-trapping layer 504B. In another specific embodiment, forming graded blocking dielectric layer 504C from at least two different materials includes depositing a first dielectric layer having a first dielectric constant and, subsequently, depositing a second dielectric layer having a second dielectric constant, wherein the second dielectric constant is greater than the first dielectric constant. In a particular embodiment, the first dielectric layer has a thickness approximately in the range of 0.5-3 nanometers, the second dielectric layer has a thickness approximately in the range of 2-5 nanometers, and the first and second dielectric layers are not inter-mixed. Thus, in accordance with an embodiment of the present invention, multi-layer blocking dielectric region 504C has an abrupt interface between first dielectric layer 506 and second dielectric layer 508, as depicted in FIG. 5.

Gate layer 504D may be composed of any conductor or semiconductor material suitable for accommodating a bias during operation of a SONOS-type transistor. In accordance with an embodiment of the present invention, gate layer 504D is formed by a chemical vapor deposition process and is composed of doped poly-crystalline silicon. In another embodiment, gate layer 504D is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In one embodiment, gate layer 504D is a high work-function gate layer.

Figure 6:
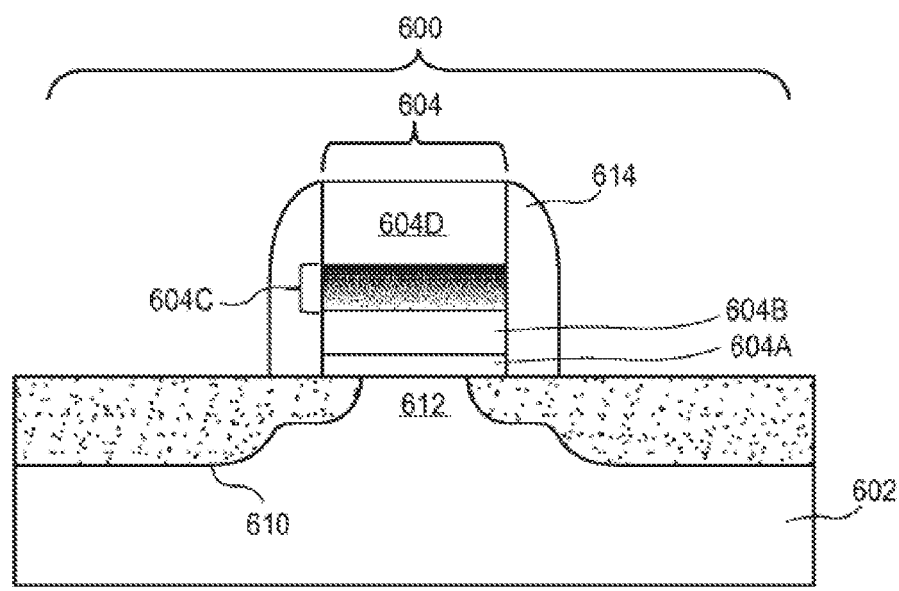
FIG. 6 illustrates a cross-sectional view of a nonvolatile charge trap memory device having a graded high dielectric constant blocking layer, in accordance with an embodiment of the present invention.

In another aspect of the present invention, a nonvolatile charge trap memory device may include a graded blocking dielectric layer. FIG. 6 illustrates a cross-sectional view of a nonvolatile charge trap memory device having a graded high dielectric constant blocking layer, in accordance with an embodiment of the present invention.

Referring to FIG. 6, semiconductor device 600 includes a gate stack 604 formed over a substrate 602. Semiconductor device 600 further includes source and drain regions 610 in substrate 602 on either side of gate stack 604, defining a channel region 612 in substrate 602 underneath gate stack 604. Gate stack 604 includes a tunnel dielectric layer 604A, a charge-trapping layer 604B, a graded blocking dielectric layer 604C, and a gate layer 604D. Thus, gate layer 604D is electrically isolated from substrate 602. A pair of dielectric spacers 614 isolates the sidewalls of gate stack 604.

Semiconductor device 600 may be any semiconductor device described in association with semiconductor device 500 from FIG. 5. Substrate 602, source and drain regions 610 and channel region 612 may be composed of any material and dopant impurity atoms described in association with substrate 502, source and drain regions 510 and channel region 512, respectively, from FIG. 5. Tunnel dielectric layer 604A, charge-trapping layer 604B and gate layer 604D may be composed of any material described in association with tunnel dielectric layer 504A, charge-trapping layer 504B and gate layer 504D, respectively, from FIG. 5.

However, in contrast to semiconductor device 500, semiconductor device 600 includes a graded blocking dielectric layer 604C, as depicted in FIG. 6. In accordance with an embodiment of the present invention, graded blocking dielectric layer 604C is disposed directly above charge-trapping layer 604B and directly below gate layer 604D. In an embodiment, the portion of graded blocking dielectric layer 604C directly adjacent to charge-trapping layer 604B has a large barrier height while the portion of graded blocking dielectric layer 604C directly adjacent to gate layer 604D has a high dielectric constant. In one embodiment, the barrier height of the portion of graded blocking dielectric layer 604C directly adjacent to charge-trapping layer 604B is at least approximately 2 eV. In a specific embodiment, the barrier height of the portion of graded blocking dielectric layer 604C directly adjacent to charge-trapping layer 604B is at least approximately 3 eV. In an embodiment, the dielectric constant of graded blocking dielectric layer 604C has a low-to-high gradient in the direction from charge-trapping layer 604B to gate layer 604D. In one embodiment, the portion of graded blocking dielectric layer 604C directly adjacent to charge-trapping layer 604B is composed substantially of silicon dioxide and the portion of graded blocking dielectric layer 604C directly adjacent to gate layer 604D is composed substantially of silicon nitride. In another embodiment, the portion of graded blocking dielectric layer 604C directly adjacent to charge-trapping layer 604B is composed substantially of silicon dioxide and the portion of graded blocking dielectric layer 604C directly adjacent to gate layer 604D is composed substantially of a material such as, but not limited to, aluminum oxide, hafnium oxide, zirconium oxide, hafnium silicate, zirconium silicate, hafnium oxynitride, hafnium zirconium oxide or lanthanum oxide. In a specific embodiment, the portion of graded blocking dielectric layer 604C directly adjacent to charge-trapping layer 604B is composed substantially of a material having a dielectric constant approximately in the range of 3.5-4.5 and the portion of graded blocking dielectric layer 604C directly adjacent to gate layer 604D is substantially composed of a material having a dielectric constant above approximately 7. In accordance with an embodiment of the present invention, graded blocking dielectric layer 604C is formed in part by a chemical vapor deposition process. In one embodiment, graded blocking dielectric layer 604C is formed from at least two different materials. In a specific embodiment, forming graded blocking dielectric layer 604C from at least two different materials includes oxidizing a top portion of charge-trapping layer 604B and, subsequently, depositing a dielectric layer above the oxidized portion of charge-trapping layer 604B. In another specific embodiment, forming graded blocking dielectric layer 604C from at least two different materials includes depositing a first dielectric layer having a first dielectric constant and, subsequently, depositing a second dielectric layer having a second dielectric constant, wherein the second dielectric constant is greater than the first dielectric constant. In a particular embodiment, the first dielectric layer has a thickness approximately in the range of 0.5-3 nanometers, the second dielectric layer has a thickness approximately in the range of 2-5 nanometers, and the first and second dielectric layers are then intermixed. In one embodiment, the first and second dielectric layers are inter-mixed upon deposition of the second dielectric layer on the first dielectric layer. In another embodiment, the first and second dielectric layers are intermixed in an anneal process subsequent to the formation of the first and second dielectric layers. Thus, in accordance with an embodiment of the present invention, there is no distinct interface within graded blocking dielectric layer 604C, as depicted in FIG. 6.

A nonvolatile charge trap memory device may be fabricated to include a multi-layer blocking dielectric region. FIGS. 7 A-7I illustrate cross-sectional views representing operations in the formation of a nonvolatile charge trap memory device having a multi-layer high dielectric constant blocking region, in accordance with an embodiment of the present invention.

Referring to FIG. 7 A, a substrate 702 is provided. Substrate 702 may be composed of any material and have any characteristics described in association with substrate 502 from FIG. 5. Referring to FIG. 7B, a tunnel dielectric layer 720 is formed on the top surface of substrate 702. Tunnel dielectric layer 720 may be formed from any material, from any process, and have any thickness described in association with tunnel dielectric layer 504A from FIG. 5. Referring to FIG. 7C, a charge-trapping layer 722 is formed on the top surface of tunnel dielectric layer 720. Charge-trapping layer 722 may be formed from any material, from any process, and have any thickness described in association with charge-trapping layer 504B from FIG. 5.

Figure 7A:
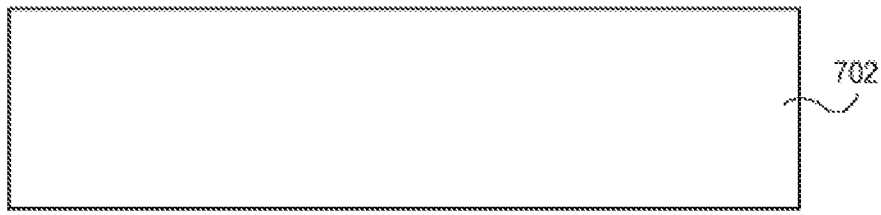
FIG. 7 A illustrates a cross-sectional view representing an operation in the formation of a nonvolatile charge trap memory device having a multi-layer high dielectric constant blocking region, in accordance with an embodiment of the present invention.
FIG. 7B illustrates a cross-sectional view representing an operation in the formation of a nonvolatile charge trap memory device having a multi-layer high dielectric constant blocking region, in accordance with an embodiment of the present invention.
FIG. 7C illustrates a cross-sectional view representing an operation in the formation of a nonvolatile charge trap memory device having a multi-layer high dielectric constant blocking region, in accordance with an embodiment of the present invention.
FIG. 7D illustrates a cross-sectional view representing an operation in the formation of a nonvolatile charge trap memory device having a multi-layer high dielectric constant blocking region, in accordance with an embodiment of the present invention.
FIG. 7E illustrates a cross-sectional view representing an operation in the formation of a nonvolatile charge trap memory device having a multi-layer high dielectric constant blocking region, in accordance with an embodiment of the present invention.
FIG. 7F illustrates a cross-sectional view representing an operation in the formation of a nonvolatile charge trap memory device having a multi-layer high dielectric constant blocking region, in accordance with an embodiment of the present invention.
FIG. 7G illustrates a cross-sectional view representing an operation in the formation of a nonvolatile charge trap memory device having a multi-layer high dielectric constant blocking region, in accordance with an embodiment of the present invention.
FIG. 7H illustrates a cross-sectional view representing an operation in the formation of a nonvolatile charge trap memory device having a multi-layer high dielectric constant blocking region, in accordance with an embodiment of the present invention.
FIG. 7I illustrates a cross-sectional view representing an operation in the formation of a nonvolatile charge trap memory device having a multi-layer high dielectric constant blocking region, in accordance with an embodiment of the present invention.
Figure 7B:
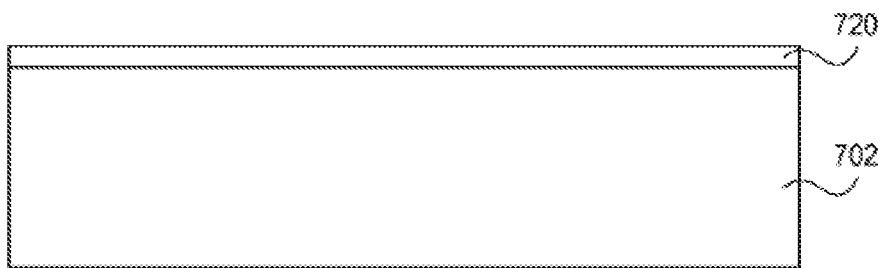
Figure 7C:
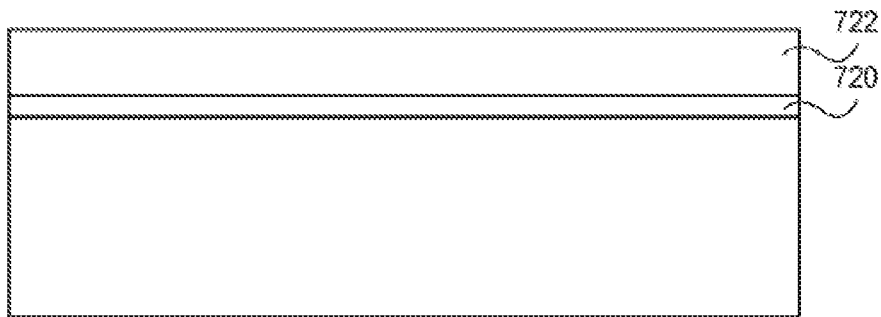
Figure 7D:
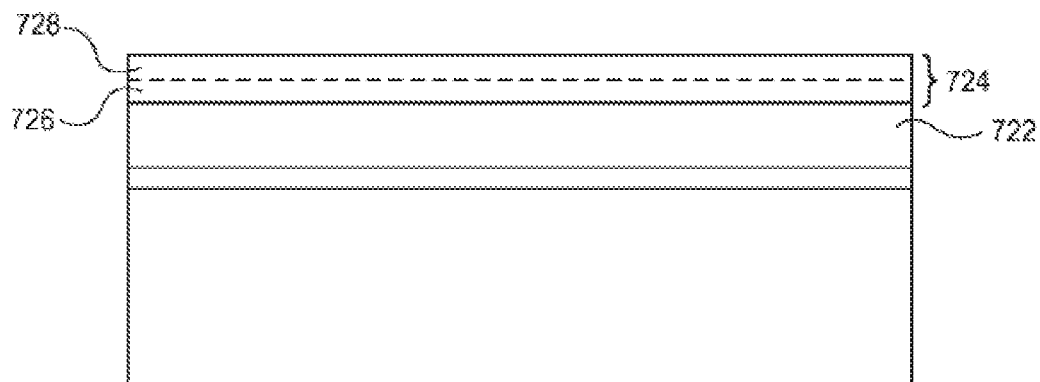

Referring to FIG. 7D, a multi-layer blocking dielectric region 724 is formed on the top surface of charge-trapping layer 722. Multi-layer blocking dielectric region 724 includes a first dielectric layer 726 disposed above charge-trapping layer 722 and a second dielectric layer 728 disposed above first dielectric layer 726. In accordance with an embodiment of the present invention, multi-layer blocking dielectric region 724 is a bi-layer blocking dielectric region and includes a first dielectric layer 726 and a second dielectric layer 728, as depicted in FIG. 7D. First dielectric layer 726 and second dielectric layer 728 may be formed by any technique, composed of any materials, and have any thicknesses described in association with first dielectric layer 506 and second dielectric layer 508, respectively, from FIG. 5. In accordance with an embodiment of the present invention, multi-layer blocking dielectric region 724 has an abrupt interface between first dielectric layer 726 and second dielectric layer 728, as depicted in FIG. 7D. In one embodiment, multi-layer blocking dielectric region 724 is formed from at least two different materials. In a specific embodiment, forming multi-layer blocking dielectric region 724 from at least two different materials includes oxidizing a top portion of charge-trapping layer 722 and, subsequently, depositing a dielectric layer above the oxidized portion of charge-trapping layer 724. In another specific embodiment, forming multi-layer blocking dielectric region 724 from at least two different materials includes depositing a first dielectric layer having a first dielectric constant and, subsequently, depositing a second dielectric layer having a second dielectric constant, wherein the second dielectric constant is greater than the first dielectric constant.

Figure 7E:
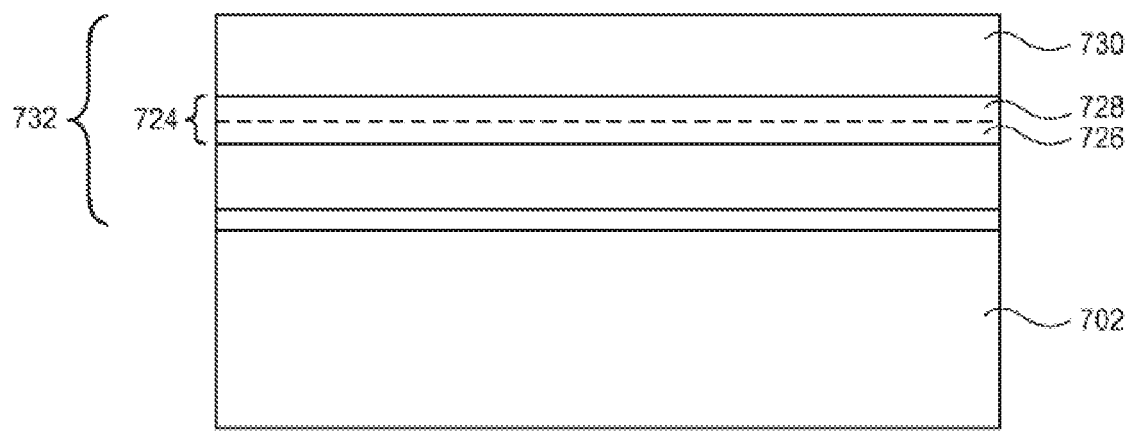

Referring to FIG. 7E, a gate layer 730 is formed on the top surface of multi-layer blocking dielectric region 724. Gate layer 730 may be formed from any material and from any process described in association with gate layer 504D from FIG. 5. Thus, a gate stack 732 may be formed above substrate 702.

Figure 7F:
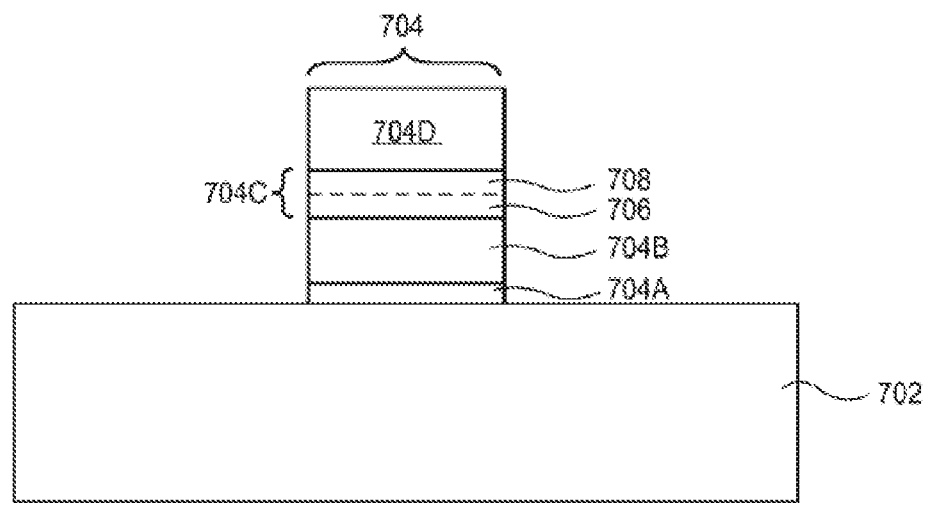

Referring to FIG. 7F, gate stack 732 is patterned to form a patterned gate stack 704 above substrate 702. Patterned gate stack 704 includes a patterned tunnel dielectric layer 704A, a patterned charge-trapping layer 704B, a patterned multi-layer blocking dielectric region 704C, and a patterned gate layer 704D. Patterned multi-layer blocking dielectric region 704C includes a patterned first dielectric layer 706 and a patterned second dielectric layer 708. Gate stack 732 may be patterned to form patterned gate stack 704 by any process suitable to provide substantially vertical sidewalls for gate stack 704 with high selectivity to substrate 702. In accordance with an embodiment of the present invention, gate stack 732 is patterned to form patterned gate stack 704 by a lithography and etch process. In a specific embodiment, the etch process is an anisotropic etch process utilizing gases such as, but not limited to, carbon tetrafluoride (CF4), 0 2, hydrogen bromide (HBr) and chlorine ($Cl_2$).

Figure 7G:
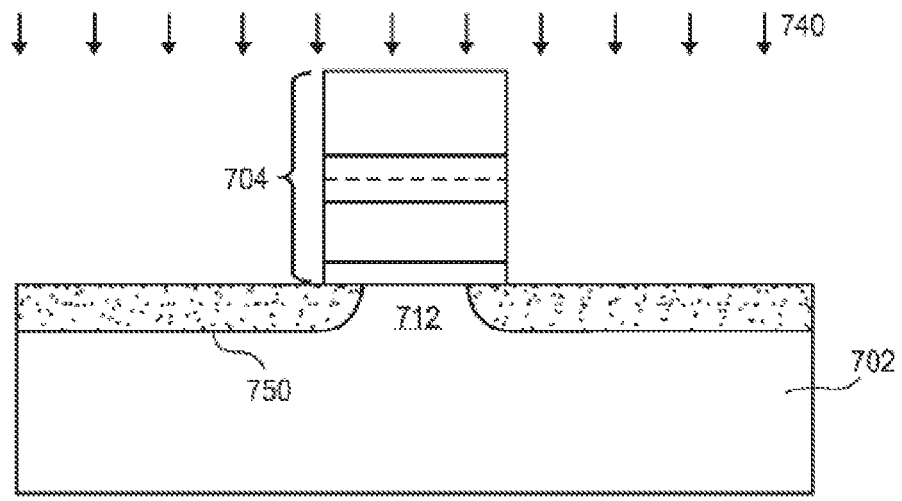

Referring to FIG. 7G, it may be desirable to implant dopant impurity atoms 740 into the exposed portions of substrate 704 to form source and drain tip extension regions 750. Source and drain tip extension regions 750 will ultimately become part of source and drain regions formed subsequently, as described below. Thus, by forming source and drain tip extension regions 750 as defined by the location of patterned gate stack 704, channel region 712 may be defined, as depicted in FIG. 7G. In one embodiment, the conductivity type and the concentration of dopant impurity atoms used to form source and drain tip extension regions 750 are substantially the same as those used to form source and drain regions, described below.

Figure 7H:
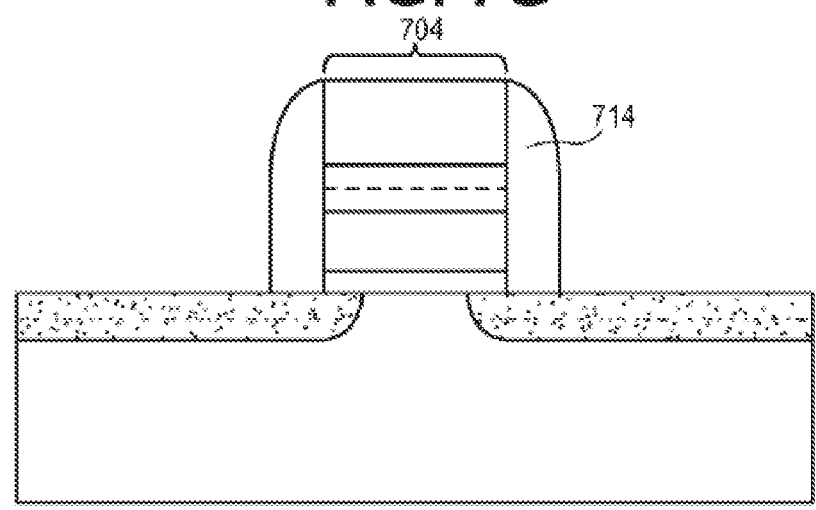
Figure 7I:
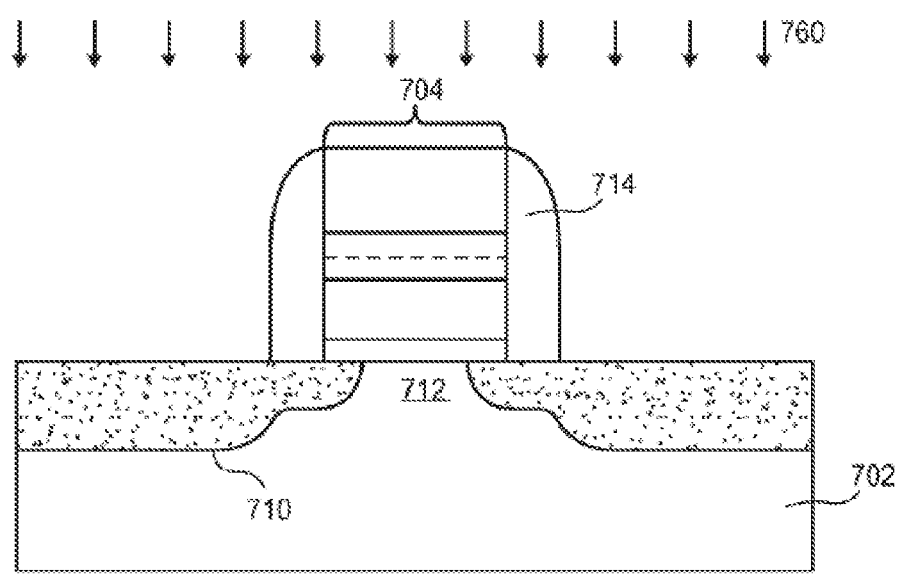

Referring to FIG. 7H, it may be desirable to form a pair of dielectric spacers 714 on the sidewalls of patterned gate stack 704, as is well-known in the art. Finally, referring to FIG. 7I, source and drain regions 710 are formed by implanting dopant impurity atoms 760 into the exposed portions of substrate 704. Source and drain regions 710 may have any characteristics as those described in association with source and drain regions 510 from FIG. 5. In accordance with an embodiment of the present invention, the profile of source and drain regions 710 is defined by dielectric spacers 714, patterned gate stack 704 and source and drain tip extension regions 750, as depicted in FIG. 7I.

Figure 8A:
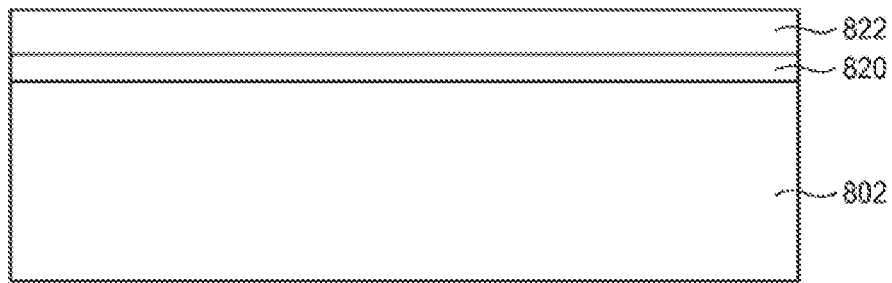
FIG. 8A illustrates a cross-sectional view representing an operation in the formation of a nonvolatile charge trap memory device having a graded high dielectric constant blocking layer, in accordance with an embodiment of the present invention.
Figure 8B:
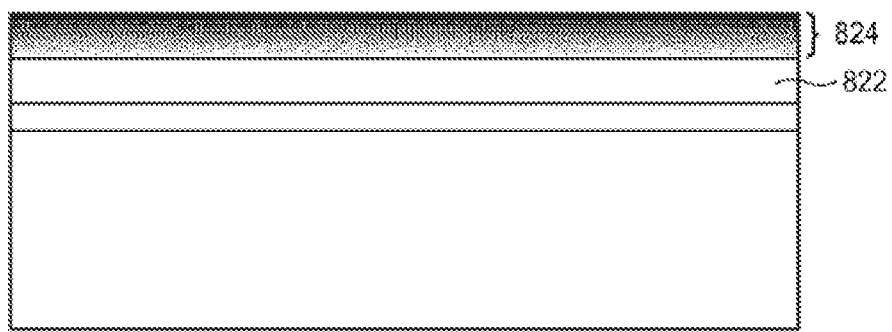
FIG. 8B illustrates a cross-sectional view representing an operation in the formation of a nonvolatile charge trap memory device having a graded high dielectric constant blocking layer, in accordance with an embodiment of the present invention.
Figure 8C:
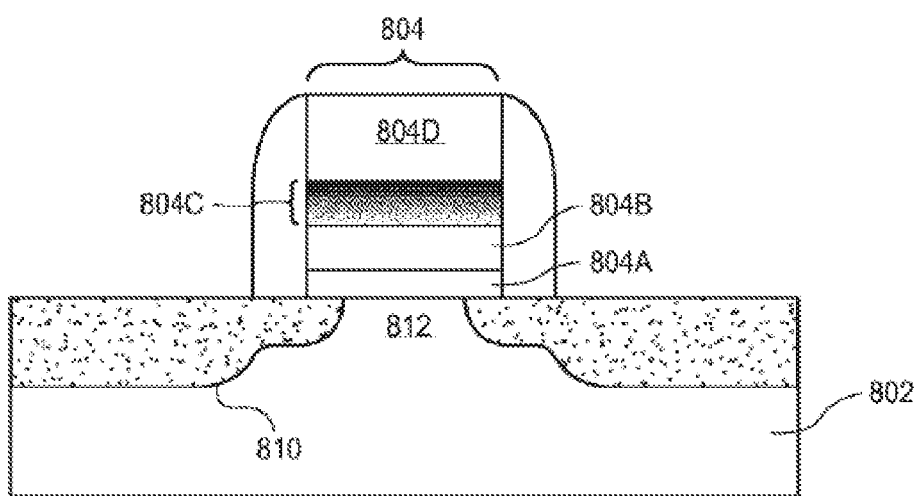
FIG. 8C illustrates a cross-sectional view representing an operation in the formation of a nonvolatile charge trap memory device having a graded high dielectric constant blocking layer, in accordance with an embodiment of the present invention.

In another embodiment, a nonvolatile charge trap memory device is fabricated to include a graded blocking dielectric layer. FIGS. 8A-8C illustrate cross-sectional views representing operations in the formation of a nonvolatile charge trap memory device having a graded high dielectric constant blocking layer, in accordance with an embodiment of the present invention.

Referring to FIG. 8A, a charge-trapping layer 822 and a tunnel dielectric layer 820, formed on the top surface of a substrate 802, are provided. Substrate 802 may be composed of any material and have any characteristics described in association with substrate 602 from FIG. 6. Charge-trapping layer 822 and tunnel dielectric layer 820 may be formed from any material, from any process, and have any thickness described in association with charge-trapping layer 604B and tunnel dielectric layer 604A, respectively, from FIG. 6.

Referring to FIG. 8B, a graded blocking dielectric layer 824 is formed on the top surface of charge-trapping layer 822. In accordance with an embodiment of the present invention, graded blocking dielectric layer 824 is formed directly above charge-trapping layer 822, as depicted in FIG. 8B. In one embodiment, graded blocking dielectric layer 824 has a low-to-high gradient in the direction from charge trapping layer 822 to the top surface of graded blocking dielectric layer 824. Graded blocking dielectric layer 824 may be formed by any technique, composed of any materials, and have any thicknesses described in association with graded blocking dielectric layer 604C from FIG. 6. In accordance with an embodiment of the present invention, there is no distinct interface within graded blocking dielectric layer 824, as depicted in FIG. 8B. In one embodiment, graded blocking dielectric layer 824 is formed from at least two different materials. In a specific embodiment, forming graded blocking dielectric layer 824 from at least two different materials includes oxidizing a top portion of charge-trapping layer 822 and, subsequently, depositing a dielectric layer above the oxidized portion of charge-trapping layer 824. In another specific embodiment, forming graded blocking dielectric layer 824 from at least two different materials includes depositing a first dielectric layer having a first dielectric constant and, subsequently, depositing a second dielectric layer having a second dielectric constant, wherein the second dielectric constant is greater than the first dielectric constant.

Referring to FIG. 8C, process steps similar to those described in association with FIGS. 7E-7I are carried out to form a nonvolatile charge trap memory device having a graded blocking dielectric layer. Thus, a patterned gate stack 804 is formed over a substrate 802. Source and drain regions 810 are formed on either side of patterned gate stack 804, defining a channel region 812. Patterned gate stack 804 includes a patterned tunnel dielectric layer 804A, a patterned charge-trapping layer 804B, a patterned graded blocking dielectric layer 804C and a patterned gate layer 804D.

Implementations and Alternatives

In another aspect the present disclosure is directed to multigate or multigate-surface memory devices including charge-trapping regions overlying two or more sides of a channel formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 9A:
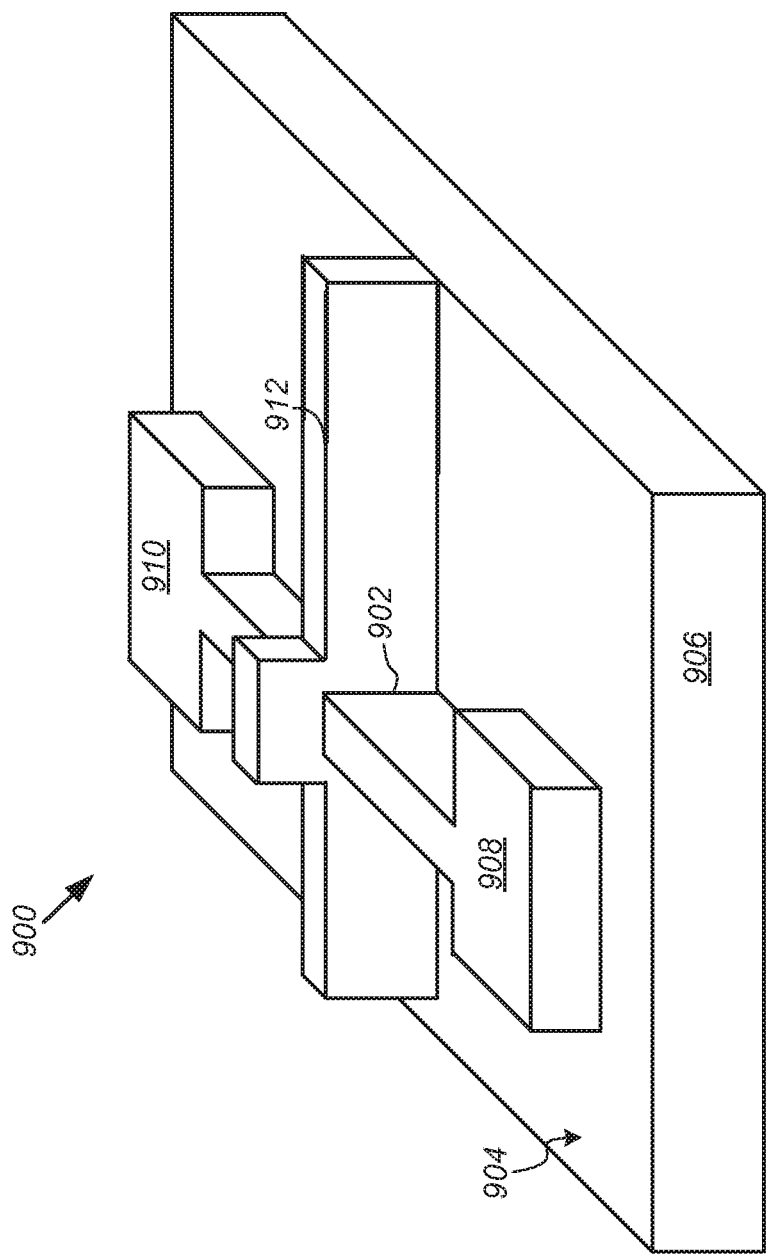
FIG. 9A illustrates a non-planar multigate device including a graded or multi-layer high dielectric constant blocking region.

FIG. 9A illustrates one embodiment of a non-planar multigate memory device 900 including a split charge-trapping region and a graded or multi-layer blocking dielectric formed above a first region of a substrate. Referring to FIG. 9A, the memory device 900, commonly referred to as a finFET, includes raised a channel 902 formed from a thin film or layer of semiconducting material overlying a surface 904 on a substrate 906 connecting a source 908 and a drain 910 of the memory device. The channel 902 is enclosed on three sides by a fin which forms a gate 912 of the device. The thickness of the gate 912 (measured in the direction from source to drain) determines the effective channel length of the device.

Figure 9B:
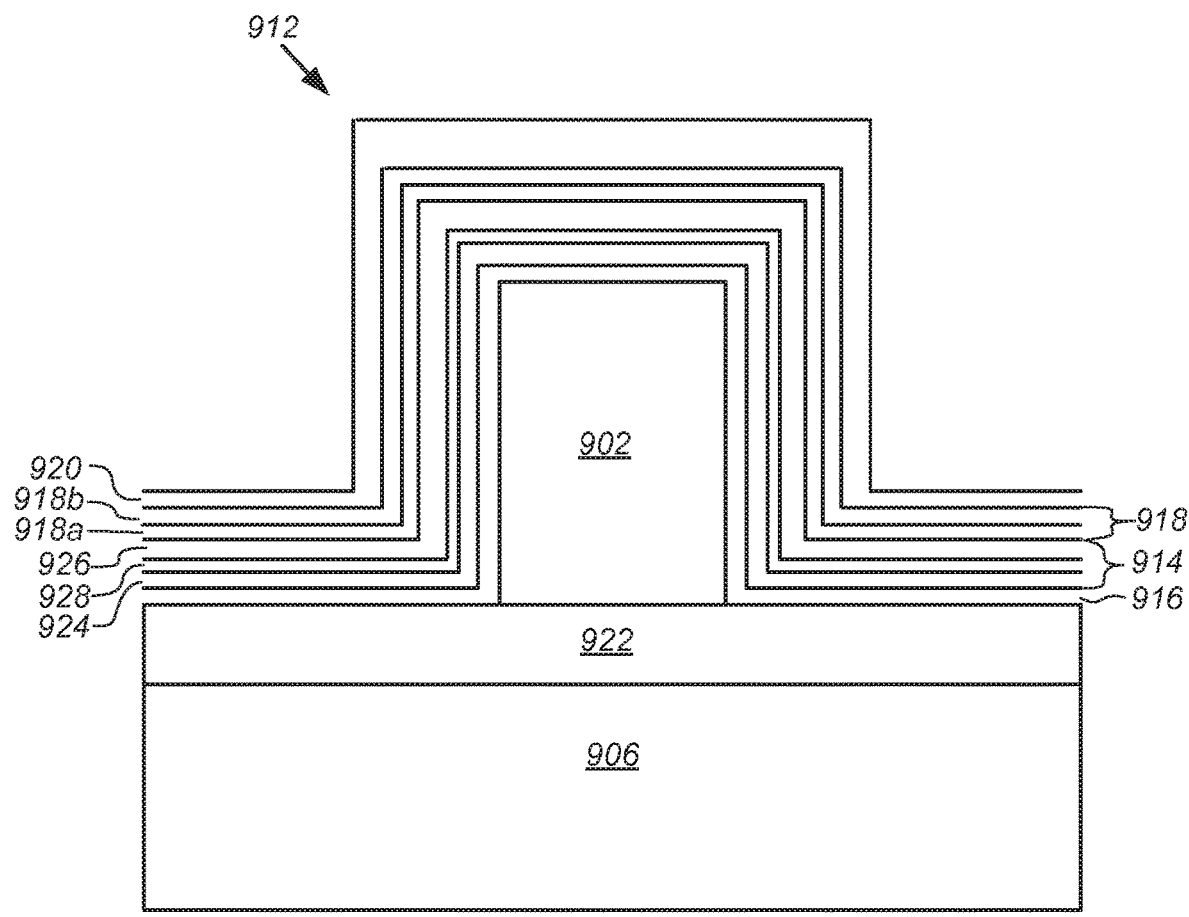
FIG. 9B illustrates a cross-sectional view of the non-planar multigate device of FIG. 9A including a multi-layer high dielectric constant blocking region.

FIG. 9B is a cross-sectional view of a portion of the non-planar memory device of FIG. 9A including a portion of the substrate 906, the channel 902 and the gate 912 illustrating a split charge-trapping region 914 and a multi-layer blocking dielectric 918. In accordance with the present disclosure, the gate 912 can include a split charge-trapping region 914 and a graded or multi-layer blocking dielectric 918. The gate 912 further includes a tunnel oxide 916 overlying the channel 902, and a metal gate layer 920 overlying the blocking dielectric to form a control gate of the memory device 900. In some embodiments a doped polysilicon may be deposited instead of metal to provide a polysilicon gate layer. Suitable dopants include, for example a p-type dopant such as Boron, to provide a P+ polysilicon gate. The channel 902 and gate 912 can be formed directly on substrate 906 or on an insulating or dielectric layer 922, such as a buried oxide layer, formed on or over the substrate 906 as shown in FIG. 9B.

Referring again to FIG. 9B, the split charge-trapping region 914 includes at least one bottom or first charge-trapping layer 924 comprising nitride closer to the tunnel oxide 916, and a top or second charge-trapping layer 926 overlying the first charge-trapping layer. Generally, the second charge-trapping layer 926 comprises a silicon-rich, oxygen-lean nitride layer and comprises a majority of a charge traps distributed in multiple charge-trapping layers, while the first charge-trapping layer 924 comprises an oxygen-rich nitride or silicon oxynitride, and is oxygen-rich relative to the second charge-trapping layer to reduce the number of charge traps therein. By oxygen-rich it is meant wherein a concentration of oxygen in the first charge-trapping layer 924 is from about 11 to about 40%, whereas a concentration of oxygen in second charge-trapping layer 926 is less than about 5%.

In some embodiments, such as that shown in FIG. 9B, the split charge-trapping region 914 further includes at least one thin, intermediate or anti-tunneling layer 928 comprising a dielectric, such as an oxide, separating the second charge-trapping layer 926 from the first charge-trapping layer 924. The anti-tunneling layer 928 substantially reduces the probability of electron charge that accumulates at the boundaries of the upper nitride layer 926 during programming from tunneling into the bottom nitride layer 924, resulting in lower leakage current than for the conventional structures.

Either or both of the first charge-trapping layer 924 and the second charge-trapping layer 926 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The second charge-trapping layer 926 has a stoichiometric composition of oxygen, nitrogen and/or silicon different from that of the first charge-trapping layer 924, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 928 comprising oxide, the anti-tunneling layer can be formed by oxidation of the bottom oxynitride layer, to a chosen depth using radical oxidation. Radical oxidation may be performed, for example, at a temperature of 1100-1100° C. using a single wafer tool, or 800-900° C. using a batch reactor tool. A mixture of $H_2$ and $O_2$ gasses may be employed at a pressure of 300-500 Tor for a batch process, or 11-15 Tor using a single vapor tool, for a time of 1-2 minutes using a single wafer tool, or 30 min-1 hour using a batch process.

A suitable thickness for the first charge-trapping layer 924 may be from about 30 Å to about 80 Å (with some variance permitted, for example ±10 Å), of which about 5-20 Å may be consumed by radical oxidation to form the anti-tunneling layer 928. A suitable thickness for the second charge-trapping layer 926 may be at least 30 Å. In certain embodiments, the second charge-trapping layer 926 may be formed up to 90 Å thick, of which 30-70 Å may be consumed by radical oxidation to form the blocking dielectric 918. A ratio of thicknesses between the first charge-trapping layer 924 and second charge-trapping layer 926 is approximately 1:1 in some embodiments, although other ratios are also possible. In other embodiments, the second charge-trapping layer 926 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Referring again to FIG. 9B the blocking dielectric region can comprise a multi-layer blocking dielectric region disposed above split charge-trapping region. In the embodiment shown the multi-layer blocking dielectric 918 is a bi-layer blocking dielectric and includes a first dielectric layer 918a formed on the second charge-trapping layer 926 and a second dielectric layer 918b formed above first dielectric layer. First dielectric layer 918a and second dielectric layer 918b may be formed by any technique, composed of any materials, and have any thicknesses described above in association with first dielectric layer 506 and second dielectric layer 508, respectively, from FIG. 5. Generally, the multi-layer blocking dielectric 918 is formed from at least two different materials and has an abrupt interface between first dielectric layer 918a and second dielectric layer 918b, as depicted in FIG. 9B.

The multi-layer blocking dielectric 918 can be formed by oxidizing a top portion of the second charge-trapping layer 926 to form a first dielectric layer 918a having a first dielectric constant and, subsequently, depositing a material having a second dielectric constant above the first dielectric layer to form a second dielectric layer 918b, wherein the second dielectric constant is greater than the first dielectric constant. It will be appreciated that the thickness of the second charge-trapping layer 926 may be adjusted or increased as some of the second charge-trapping layer will be effectively consumed or oxidized during the process of thermally growing the first dielectric layer 918a. In one embodiment, forming the first dielectric layer 918a is accomplished using a radical oxidation process, such as In-Situ Steam Generation (ISSG). ISSG can be accomplished by placing the substrate 906 in a deposition or processing chamber, heating the substrate to a temperature from about 700° C. to about 850° C., and exposing it to a wet vapor for a predetermined period of time selected based on a desired thickness of the finished first dielectric layer 918a. Exemplary process times are from about 5 to about 20 minutes. The oxidation can be performed at atmospheric or at low pressure.

In other embodiments, forming the multi-layer blocking dielectric 918 comprises depositing at least two different materials, including depositing a first material having a first dielectric constant to form the first dielectric layer 918a and, subsequently, depositing a material having a second dielectric constant to form the second dielectric layer 918b. In certain embodiments, the first dielectric layer 918a is a high temperature oxide deposited in a high-temperature oxide (HTO) process. Generally, the HTO process involves exposing the substrate 906 with the split charge-trapping region 914 formed thereon to a silicon source, such as silane, chlorosilane, or dichlorosilane, and an oxygen-containing gas, such as $O_2$ or $N_2O$ in a chemical vapor deposition (CVD) chamber at a pressure of from about 50 mT to about 1000 mT, for a period of from about 10 minutes to about 120 minutes while maintaining the substrate at a temperature of from about 650° C. to about 850° C.

Alternatively, either or both of the first dielectric layer 918a and the second dielectric layer 918b may comprise a high K dielectric formed by any technique, composed of any materials, and have any thicknesses as described above in association with first dielectric layer 506 and second dielectric layer 508, respectively, from FIG. 5. Suitable high K dielectrics materials include hafnium based materials such as HfSiON, HfSiO or HfO, Zirconium based material such as ZrSiON, ZrSiO or ZrO, and Yttrium based material such as $Y_2O_3$.

Figure 9C:
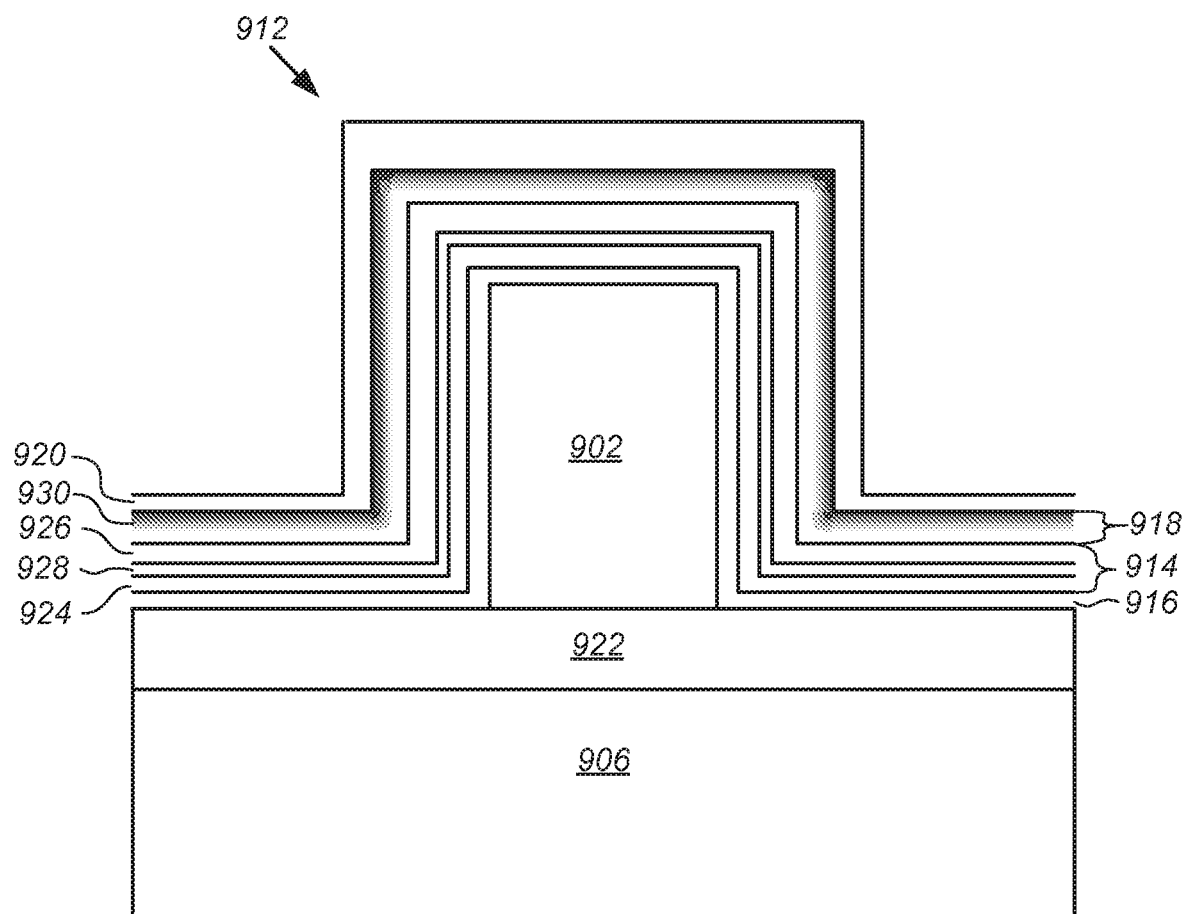
FIG. 9C illustrates a cross-sectional view of the non-planar multigate device of FIG. 9A including a graded high dielectric constant blocking region.

In other embodiments, such as that shown in FIG. 9C, the blocking dielectric 918 is fabricated to be or include a graded blocking dielectric layer 930. Referring to FIG. 9C, the graded blocking dielectric layer 930 is formed directly above or on the top of the second charge-trapping layer 926.

In one embodiment, the graded blocking dielectric layer 930 has a low-to-high gradient in the direction from the second charge-trapping layer 926 to the top surface of the graded blocking dielectric layer. Graded blocking dielectric layer 930 may be formed by any technique, composed of any materials, and have any thicknesses described in association with graded blocking dielectric layers 604C and 804C, respectively, from FIGS. 6 and 8. In accordance with an embodiment of the present invention, there is no distinct interface within the graded blocking dielectric layer 930, as depicted in FIG. 9C. Generally, the graded blocking dielectric layer 930 is formed from at least two different materials. In a specific embodiment, forming the graded blocking dielectric layer 930 from at least two different materials includes oxidizing a top portion of the second charge-trapping layer 926 and, subsequently, depositing a dielectric layer above the oxidized portion of the second charge-trapping layer.

In another specific embodiment, forming the graded blocking dielectric layer 930 from at least two different materials includes depositing a first dielectric layer having a first dielectric constant and, subsequently, depositing a second dielectric layer having a second dielectric constant, wherein the second dielectric constant is greater than the first dielectric constant, and annealing the graded blocking dielectric layer 930 to cause materials of the first and second dielectric layers to diffuse at a boundary thereof. Alternatively, the graded blocking dielectric can be formed in a single a CVD processing step by changing process gases, ratios or flow rates to form a graded blocking dielectric having different stoichiometric composition across a thickness of the layer.

As with the multi-layer embodiment described above, either or both of the materials of the first second dielectric layers may comprise a high K dielectric formed by any suitable technique, and having any thicknesses. Suitable high K dielectrics materials include hafnium based materials such as HfSiON, HfSiO or HfO, Zirconium based material such as ZrSiON, ZrSiO or ZrO, and Yttrium based material such as $Y_2O_3$.

Figure 10:
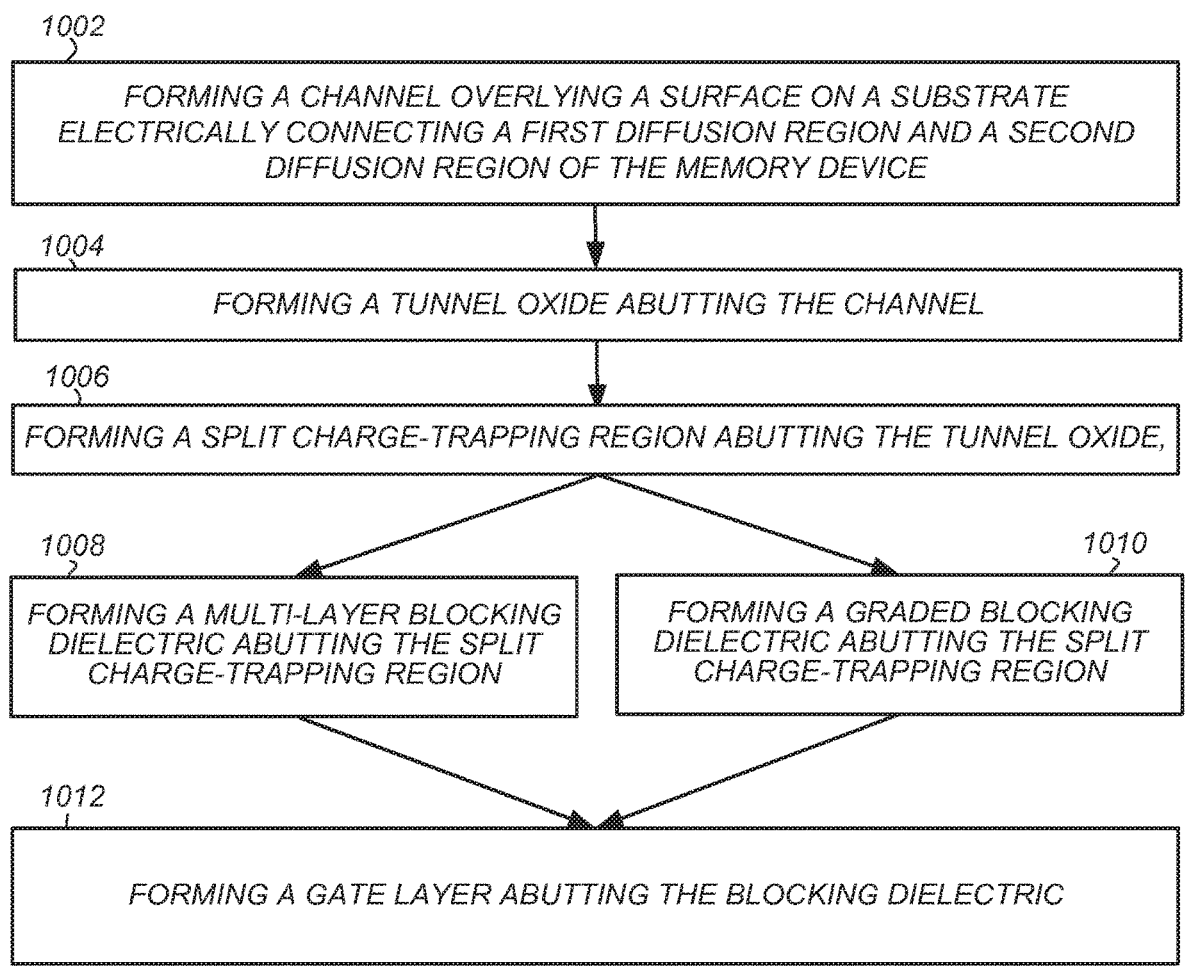
FIG. 10 illustrates a flow diagram depicting sequences of particular modules employed in the fabricating a non-planar multigate device including a graded or multi-layer high dielectric constant blocking region.

FIG. 10 illustrates a flow diagram depicting sequences of particular modules employed in the fabrication process of a non-planar or multigate non-volatile memory device including a graded or multi-layer high dielectric constant blocking region. Referring to FIG. 10, the method begins with formation of a semiconducting channel or channel comprising a semiconducting material overlying a surface on a substrate and electrically connecting a first diffusion region and a second diffusion region of the memory device (module 1002). The channel can be formed by depositing on a surface of the substrate a layer of semiconducting material and patterning the layer using any known photolithographic techniques. The semiconducting material may be composed of a single crystal of a material which may include, but is not limited to, silicon, germanium, silicon-germanium or a III-V compound semiconductor material deposited by any conventional technique, such as, but not limited to epitaxial deposition in a LPCVD chamber. A tunnel dielectric or oxide is formed overlying or abutting the channel (module 1004). The tunnel dielectric can include a silicon oxide, silicon nitride or silicon oxynitride having various stoichiometric compositions of oxygen, nitrogen and/or silicon, and may be deposited or grown by any conventional technique, including but not limited to thermally grown oxides, oxides formed by radical oxidation and HTO CVD processes, as described above.

A split charge-trapping region is formed abutting the tunnel oxide (module 1006). Generally, the split charge-trapping region comprises a first charge-trapping layer including a nitride closer to the tunnel oxide, and a second charge-trapping layer comprising a nitride overlying the first charge-trapping layer. The individual layers of the split charge-trapping region can include silicon oxides, silicon oxynitrides and silicon nitrides having various stoichiometric compositions of oxygen, nitrogen and/or silicon, and may deposited or grown by any conventional technique, such as, but not limited to thermally grown oxides, radical oxidation and CVD processes, as described above. In some embodiments, the split charge-trapping region can further include a thin, anti-tunneling oxide layer separating the first charge-trapping layer from the second charge-trapping layer.

Next, a multi-layer or graded blocking dielectric comprising at least a first material having a first dielectric constant and a second material having a second dielectric constant greater than the first dielectric constant is formed abutting the split charge-trapping region. In some embodiments, the blocking dielectric comprises a multi-layer blocking dielectric including at least a first dielectric layer formed abutting the split charge-trapping region, and a second dielectric layer formed above first dielectric layer (module 1008). In other embodiments, the blocking dielectric comprises a graded blocking dielectric with no distinct interface between the first and second materials (module 1010). As described above in association with graded blocking dielectric layer 930, from FIG. 9C, the graded blocking dielectric can be formed by depositing first and second dielectric layers followed by annealing the by a CVD process using a process gas including $DCS/NH_3$ and $N_2O/NH_3$ gas mixtures in ratios and at flow rates tailored to provide a silicon-rich, oxygen-lean top nitride layer 930 to cause materials of the first and second dielectric layers diffuse at a boundary thereof. Alternatively, the graded blocking dielectric can be formed in a single a CVD processing step by changing process gases, ratios or flow rates to form a graded blocking dielectric having different stoichiometric composition across a thickness of the layer.

Finally, a gate layer is formed overlying the blocking dielectric to form a control gate of the memory device (module 1012). In some embodiments, the gate layer a high work-function gate layer and can include a metal-containing material formed by physical vapor deposition and may include, but is not limited to, metal nitrides, metal carbides, metal silicides, hafnium, zirconium, titanium, tantalum, aluminum, ruthenium, palladium, platinum, cobalt and nickel. In other embodiments, a doped polysilicon may be deposited instead of metal to provide a polysilicon gate layer. Suitable dopants include, for example a p-type dopant such as Boron, to provide a P+ polysilicon gate.

Figure 11A:
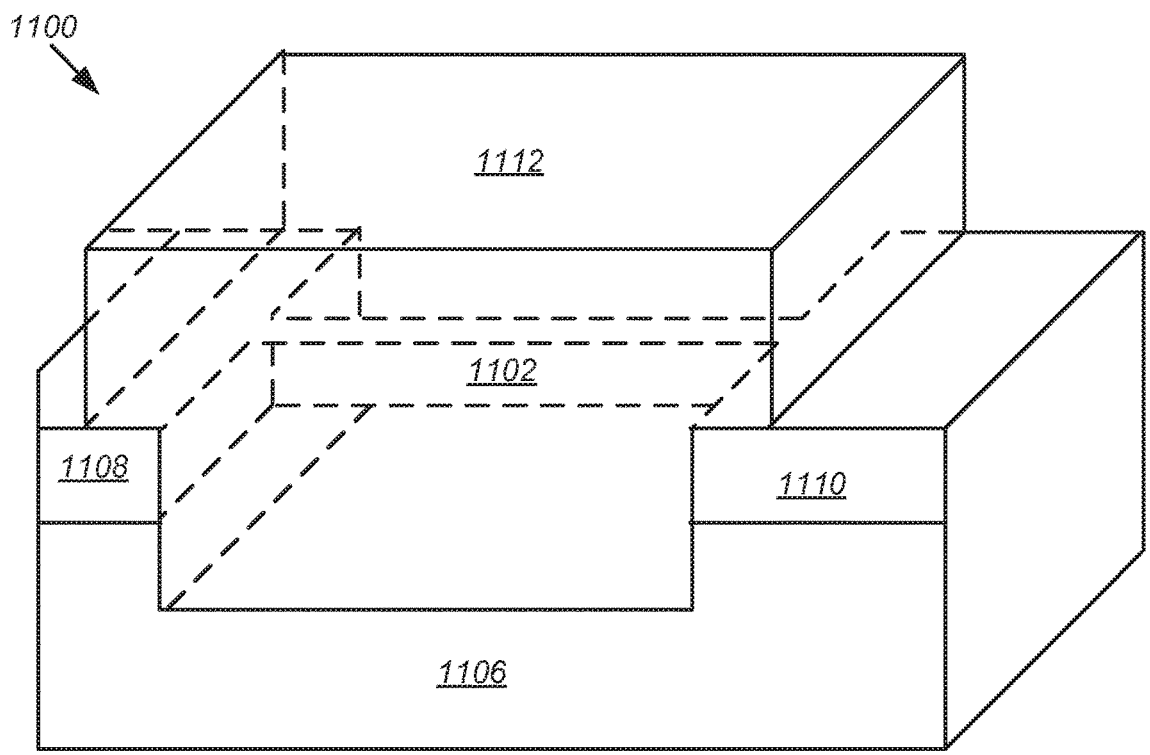
FIGS. 11A and 11B illustrate a non-planar multigate device including a multi-layer high dielectric constant blocking region and a horizontal nanowire channel.
Figure 11B:
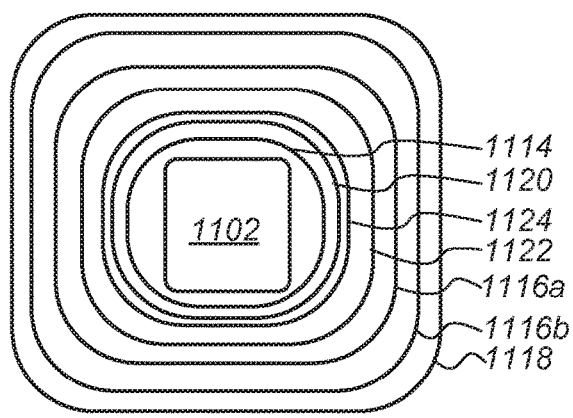

In another embodiment, shown in FIGS. 11A and 11B, the memory device can include a nanowire channel formed from a thin film of semiconducting material overlying a surface on a substrate connecting a source and a drain of the memory device. By nanowire channel it is meant a conducting channel formed in a thin strip of crystalline silicon material, having a maximum cross-sectional dimension of about 11 nanometers (nm) or less, and more preferably less than about 6 nm. Optionally, the channel can be formed to have <100> surface crystalline orientation relative to a long axis of the channel.

Referring to FIG. 11A, the memory device 1100 includes a horizontal nanowire channel 1102 formed from a thin film or layer of semiconducting material on or overlying a surface on a substrate 1106, and connecting a source 1108 and a drain 1110 of the memory device. In the embodiment shown, the device has a gate-all-around (GAA) structure in which the nanowire channel 1102 is enclosed on all sides by a gate 1112 of the device. The thickness of the gate 1112 (measured in the direction from source to drain) determines the effective channel length of the device.

In accordance with the present disclosure, the non-planar multigate memory device 1100 of FIG. 11A can include a multi-layer blocking dielectric. FIG. 11B is a cross-sectional view of a portion of the non-planar memory device of FIG. 11A illustrating a multi-layer blocking dielectric 1116a and 1116b. Referring to FIG. 11B, the gate 1112 includes a tunnel oxide 1114 overlying the nanowire channel 1102, a split charge-trapping region including layers 1120-1124, a blocking dielectric including layers 1116a and 1116b, and a gate layer 1118 overlying the blocking dielectric.

The split charge-trapping region includes at least one inner charge-trapping layer 1120 comprising nitride closer to the tunnel oxide 1114, and an outer charge-trapping layer 1122 overlying the inner charge-trapping layer. Generally, the outer charge-trapping layer 1122 comprises a silicon-rich, oxygen-lean nitride layer and comprises a majority of a charge traps distributed in multiple charge-trapping layers, while the inner charge-trapping layer 1120 comprises an oxygen-rich nitride or silicon oxynitride, and is oxygen-rich relative to the outer charge-trapping layer to reduce the number of charge traps therein.

In some embodiments, such as that shown, the split charge-trapping region further includes at least one thin, intermediate or anti-tunneling layer 1124 comprising a dielectric, such as an oxide, separating outer charge-trapping layer 1122 from the inner charge-trapping layer 1120. The anti-tunneling layer 1124 substantially reduces the probability of electron charge that accumulates at the boundaries of outer charge-trapping layer 1122 during programming from tunneling into the inner charge-trapping layer 1120, resulting in lower leakage current.

As with the embodiments described above, either or both of the inner charge-trapping layer 1120 and the outer charge-trapping layer 1122 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The outer charge-trapping layer 1122 has a stoichiometric composition of oxygen, nitrogen and/or silicon different from that of the inner charge-trapping layer 1120, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 1124 comprising oxide, the anti-tunneling layer can be formed by oxidation of the inner charge-trapping layer 1120, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Torr for a batch process, or 11-15 Tor using a single vapor tool, for a time of 1-2 minutes using a single wafer tool, or 30 min-1 hour using a batch process.

A suitable thickness for the inner charge-trapping layer 1120 may be from about 30 Å to about 80 Å (with some variance permitted, for example ±10 A), of which about 5-20 Å may be consumed by radical oxidation to form the anti-tunneling layer 1124. A suitable thickness for the outer charge-trapping layer 1122 may be at least 30 Å. In certain embodiments, the outer charge-trapping layer 1122 may be formed up to 90 Å thick, of which 30-70 Å may be consumed by radical oxidation to form the blocking dielectric. A ratio of thicknesses between the inner charge-trapping layer 1120 and the outer charge-trapping layer 1122 is approximately 1:1 in some embodiments, although other ratios are also possible.

In other embodiments, either or both of the outer charge-trapping layer 1122 and the blocking dielectric 1116a, 1116b, may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Referring again to FIG. 11B the blocking dielectric can comprise a multi-layer blocking dielectric region abutting the outer charge-trapping layer 1122. In the embodiment shown the multi-layer blocking dielectric is a bi-layer blocking dielectric and includes an inner or first dielectric layer 1116a formed on the outer charge-trapping layer 1122 and an outer or second dielectric layer 1116b formed above first dielectric layer. First dielectric layer 1116a and second dielectric layer 1116b may be formed by any technique, composed of any materials, and have any thicknesses described above in association with first dielectric layer 918a and second dielectric layer 918b, respectively. Generally, the multi-layer blocking dielectric 1116a, 1116b, is formed from at least two different materials and has an abrupt interface between first dielectric layer 1116a and second dielectric layer 1116b, as depicted in FIG. 11B.

The multi-layer blocking dielectric 1116a, 1116b, can be formed by oxidizing a top portion of the outer charge-trapping layer 1122 to form a first dielectric layer 1116a having a first dielectric constant and, subsequently, depositing a material having a second dielectric constant above the first dielectric layer to form a second dielectric layer 1116b, wherein the second dielectric constant is greater than the first dielectric constant. It will be appreciated that the thickness of the outer charge-trapping layer 1122 may be adjusted or increased as some of the outer charge-trapping layer will be effectively consumed or oxidized during the process of thermally growing the first dielectric layer 1116a. In one embodiment, forming the first dielectric layer 1116a is accomplished using a radical oxidation process, such as In-Situ Steam Generation (ISSG). ISSG can be accomplished by placing the substrate 1106 in a deposition or processing chamber, heating the substrate to a temperature from about 700° C. to about 850° C., and exposing it to a wet vapor for a predetermined period of time selected based on a desired thickness of the finished first dielectric layer 1116a. Exemplary process times are from about 5 to about 20 minutes. The oxidation can be performed at atmospheric or at low pressure.

In other embodiments, forming the multi-layer blocking dielectric 1116a, 1116b, comprises depositing at least two different materials, including depositing a first material having a first dielectric constant to form the first dielectric layer 1116a and, subsequently, depositing a material having a second dielectric constant to form the second dielectric layer 1116b. In certain embodiments, the first dielectric layer 1116a is a high temperature oxide deposited in a high-temperature oxide (HTO) process. Generally, the HTO process involves exposing the substrate 1106 with the split charge-trapping region formed thereon to a silicon source, such as silane, chlorosilane, or dichlorosilane, and an oxygen-containing gas, such as $O_2$ or $N_2O$ in a chemical vapor deposition (CVD) chamber at a pressure of from about 50 mT to about 1000 mT, for a period of from about 10 minutes to about 120 minutes while maintaining the substrate at a temperature of from about 650° C. to about 850° C.

Alternatively, either or both of the first dielectric layer 1116a and the second dielectric layer 1116b may comprise a high K dielectric formed by any technique, composed of any materials, and have any thicknesses as described above in association with first dielectric layer 506 and second dielectric layer 508, respectively, from FIG. 5. Suitable high K dielectrics materials include hafnium based materials such as HfSiON, HfSiO or HfO, Zirconium based material such as ZrSiON, ZrSiO or ZrO, and Yttrium based material such as $Y_2O_3$.

In other embodiments (not shown), the blocking dielectric is fabricated to be or include a graded blocking dielectric layer, such as graded blocking dielectric layer 930, shown in FIG. 9C. As with the embodiments described above, the graded blocking dielectric layer is formed directly above or on the top of the outer charge-trapping layer 1122.

In one embodiment, the graded blocking dielectric layer has a low-to-high gradient in the direction from the outer charge-trapping layer 1122 to a top surface of the blocking dielectric 1116. The graded blocking dielectric layer may be formed by any technique, composed of any materials, and have any thicknesses described in association with graded blocking dielectric layers 604C and 804C, respectively, from FIGS. 6 and 8.

As with the multi-layer embodiment described above, either or both of the materials of the first second dielectric layers may comprise a high K dielectric formed by any suitable technique, and having any thicknesses. Suitable high K dielectrics materials include hafnium based materials such as HfSiON, HfSiO or HfO, Zirconium based material such as ZrSiON, ZrSiO or ZrO, and Yttrium based material such as $Y_2O_3$.

Figure 11C:
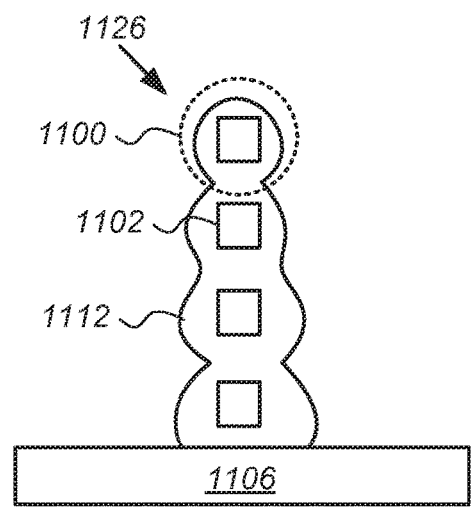
FIG. 11C illustrates a cross-sectional view of a vertical string of non-planar multigate devices of FIG. 11A.

FIG. 11C illustrates a cross-sectional view of a vertical string of non-planar multigate devices 1100 of FIG. 11A arranged in a Bit-Cost Scalable or BiCS architecture 1126. The architecture 1126 consists of a vertical string or stack of non-planar multigate devices 1100, where each device or cell includes a channel 1102 overlying the substrate 1106, and connecting a source and a drain (not shown in this figure) of the memory device, and having a gate-all-around (GAA) structure in which the nanowire channel 1102 is enclosed on all sides by a gate 1112. The BiCS architecture reduces number of critical lithography steps compared to a simple stacking of layers, leading to a reduced cost per memory bit.

In another embodiment, the memory device is or includes a non-planar device comprising a vertical nanowire channel formed in or from a semiconducting material projecting above or from a number of conducting, semiconducting layers on a substrate. In one version of this embodiment, shown in cut-away in FIG. 12A, the memory device 1200 comprises a vertical nanowire channel 1202 formed in a cylinder of semiconducting material connecting a source 1204 and drain 1206 of the device. The channel 1202 is surrounded by a tunnel oxide 1208, a charge-trapping region 1210, a blocking dielectric 1212 and a gate layer 1214 overlying the blocking dielectric to form a control gate of the memory device 1200. The channel 1202 can include an annular region in an outer layer of a substantially solid cylinder of semiconducting material, or can include an annular layer formed over a cylinder of dielectric filler material. As with the horizontal nanowires described above, the channel 1202 can comprise polysilicon or recrystallized polysilicon to form a monocrystalline channel. Optionally, where the channel 1202 includes a crystalline silicon, the channel can be formed to have <100> surface crystalline orientation relative to a long axis of the channel.

Figure 12A:
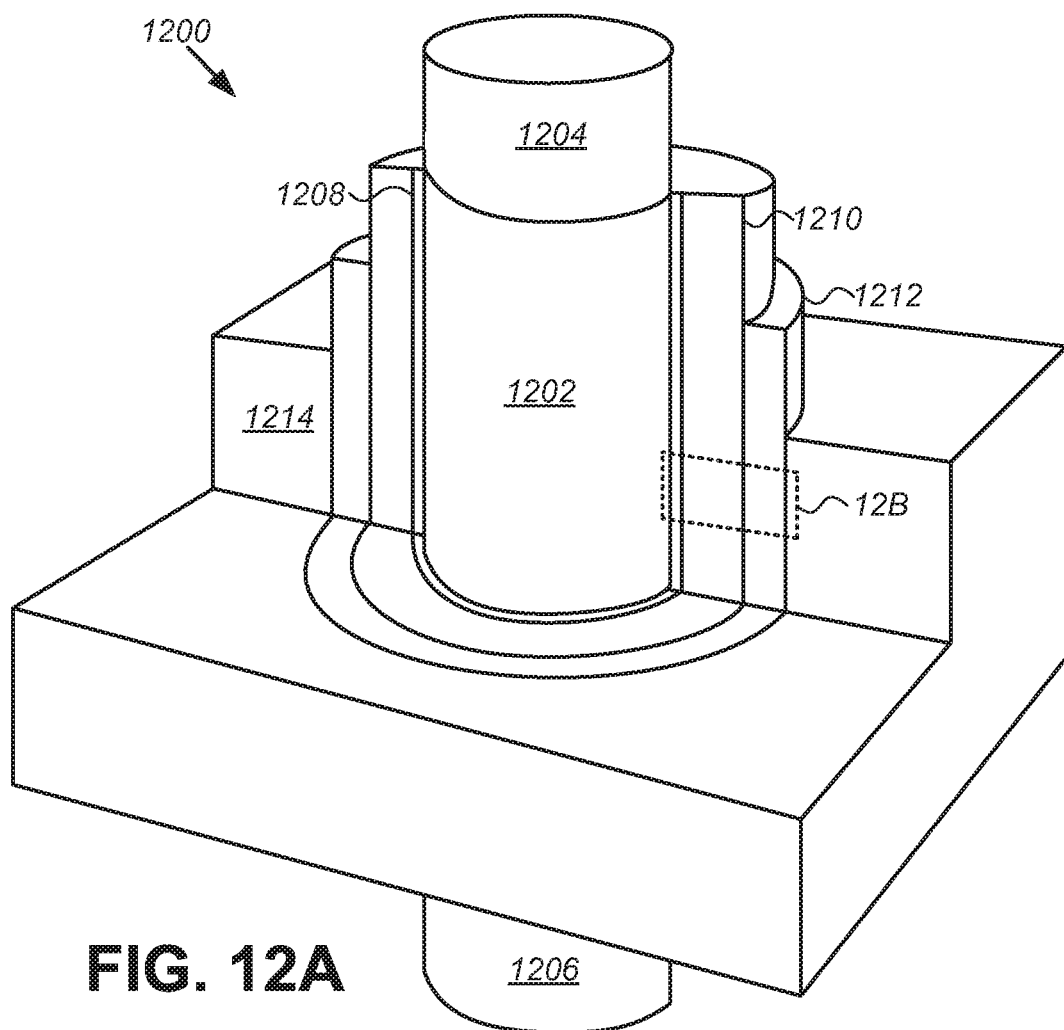
FIGS. 12A and 12B illustrate a non-planar multigate device including a multi-layer high dielectric constant blocking region and a vertical nanowire channel.
Figure 12B:
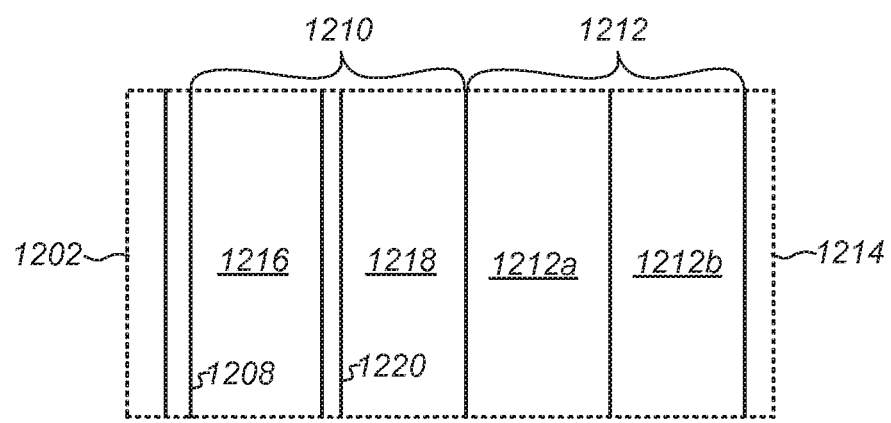

In some embodiments, such as that shown in FIG. 12B, the charge-trapping region 1210 can be a split charge-trapping region and blocking dielectric 1212 can be a multi-layer blocking dielectric.

Referring to FIG. 12B, the split charge-trapping region 1210 includes at least a first or inner charge trapping layer 1216 closest to the tunnel oxide 1208, and a second or outer charge trapping layer 1218. Optionally, the first and second charge trapping layers can be separated by an intermediate oxide or anti-tunneling layer 1220.

As with the embodiments described above, either or both of the first charge trapping layer 1216 and the second charge trapping layer 1218 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer.

Finally, either or both of the second charge trapping layer 1218 and the blocking dielectric 1212 may comprise a high K dielectric, such as HfSiON, HfSiO, HfO, ZrSiON, ZrSiO, ZrO, or $Y_2O_3$.

Referring again to FIG. 12B the blocking dielectric 1212 can comprise a multi-layer blocking dielectric region abutting the outer charge-trapping layer 1218. In the embodiment shown the multi-layer blocking dielectric is a bi-layer blocking dielectric and includes an inner or first dielectric layer 1212a formed on the outer charge-trapping layer 1218 and an outer or second dielectric layer 1212b formed above first dielectric layer. First dielectric layer 1212a and second dielectric layer 1212b may be formed by any technique, composed of any materials, and have any thicknesses described above in association with first dielectric layer 918a and second dielectric layer 918b, respectively. Generally, the multi-layer blocking dielectric 1212 is formed from at least two different materials and has an abrupt interface between first dielectric layer 1212a and second dielectric layer 1212b, as depicted in FIG. 12B.

The multi-layer blocking dielectric 1212 can be formed by oxidizing a top portion of the outer charge-trapping layer 1218 to form a first dielectric layer 1212a having a first dielectric constant and, subsequently, depositing a material having a second dielectric constant above the first dielectric layer to form a second dielectric layer 1212b, wherein the second dielectric constant is greater than the first dielectric constant. It will be appreciated that the thickness of the outer charge-trapping layer 1218 may be adjusted or increased as some of the outer charge-trapping layer will be effectively consumed or oxidized during the process of thermally growing the first dielectric layer 1212a. In one embodiment, forming the first dielectric layer 1212a is accomplished using a radical oxidation process, such as In-Situ Steam Generation (ISSG). ISSG can be accomplished by placing the substrate 1106 in a deposition or processing chamber, heating the substrate to a temperature from about 700° C. to about 850° C., and exposing it to a wet vapor for a predetermined period of time selected based on a desired thickness of the finished first dielectric layer 1212a. Exemplary process times are from about 5 to about 20 minutes. The oxidation can be performed at atmospheric or at low pressure.

In other embodiments, forming the multi-layer blocking dielectric 1212a, 1212b, comprises depositing at least two different materials, including depositing a first material having a first dielectric constant to form the first dielectric layer 1212a and, subsequently, depositing a material having a second dielectric constant to form the second dielectric layer 1212b. In certain embodiments, the first dielectric layer 1212a is a high temperature oxide deposited in a high-temperature oxide (HTO) process. Generally, the HTO process involves exposing the substrate 1106 with the split charge-trapping region formed thereon to a silicon source, such as silane, chlorosilane, or dichlorosilane, and an oxygen-containing gas, such as $O_2$ or $N_2O$ in a chemical vapor deposition (CVD) chamber at a pressure of from about 50 mT to about 1000 mT, for a period of from about 10 minutes to about 120 minutes while maintaining the substrate at a temperature of from about 650° C. to about 850° C.

Alternatively, either or both of the first dielectric layer 1212a and the second dielectric layer 1212b may comprise a high K dielectric formed by any technique, composed of any materials, and have any thicknesses as described above in association with first dielectric layer 506 and second dielectric layer 508, respectively, from FIG. 5. Suitable high K dielectrics materials include hafnium based materials such as HfSiON, HfSiO or HfO, Zirconium based material such as ZrSiON, ZrSiO or ZrO, and Yttrium based material such as $Y_2O_3$.

In other embodiments (not shown), the blocking dielectric is fabricated to be or include a graded blocking dielectric layer, such as graded blocking dielectric layer 930, shown in FIG. 9C. As with the embodiments described above, the graded blocking dielectric layer is formed directly above or on the top of the outer charge-trapping layer 1218.

In one embodiment, the graded blocking dielectric layer has a low-to-high gradient in the direction from the outer charge-trapping layer 1218 to a top surface of the blocking dielectric 1212. The graded blocking dielectric layer may be formed by any technique, composed of any materials, and have any thicknesses described in association with graded blocking dielectric layers 604C and 804C, respectively, from FIGS. 6 and 8.

As with the multi-layer embodiment described above, either or both of the materials of the first second dielectric layers may comprise a high K dielectric formed by any suitable technique, and having any thicknesses. Suitable high K dielectrics materials include hafnium based materials such as HfSiON, HfSiO or HfO, Zirconium based material such as ZrSiON, ZrSiO or ZrO, and Yttrium based material such as $Y_2O_3$.

The memory device 1200 of FIG. 12A can be made using either a gate first or a gate last scheme. FIGS. 13A-G illustrate a gate first scheme for fabricating the non-planar multigate device of FIG. 12A. FIGS. 14A-F illustrate a gate last scheme for fabricating the non-planar multigate device of FIG. 12A.

Referring to FIG. 13A, in a gate first scheme a dielectric layer 1302 is formed over a first, doped diffusion region 1304, such as a source or a drain, in a substrate 1306. A gate layer 1308 is deposited over the first dielectric layer 1302 to form a control gate of the device, and a second or upper dielectric layer 1310 formed thereover. As with embodiments described above, the first and second dielectric layers 1302, 1310, can be deposited by CVD, radical oxidation or be formed by oxidation of a portion of the underlying layer or substrate. The gate layer 1308 can comprise a metal deposited or a doped polysilicon deposited by CVD. Generally the thickness of the gate layer 1308 is from about 40-50 Å, and the first and second dielectric layers 1302, 1310, from about 20-80 Å.

Referring to FIG. 13B, a first opening 1312 is etched through the overlying gate layer 1308, and the first and second dielectric layers 1302, 1310, to the diffusion region 1304 in the substrate 1306. Next, layers of a blocking dielectric 1314, charge-trapping region 1316, and tunneling oxide 1318 are sequentially deposited in the opening and the surface of the upper dielectric layer 1310 planarize to yield the intermediate structure shown in FIG. 13C.

Referring to FIG. 13D, the blocking dielectric 1314 can comprise a multi-layer blocking dielectric region abutting the outer charge-trapping layer 1318. In the embodiment shown the multi-layer blocking dielectric is a bi-layer blocking dielectric and includes a first dielectric layer 1314a formed on the sidewall of opening of 1312 and a second dielectric layer 1314b formed above first dielectric layer. First dielectric layer 1314a and second dielectric layer 1314b may be formed by any technique, composed of any materials, and have any thicknesses described above in association with first dielectric layer 918a and second dielectric layer 918b, respectively. Generally, the multi-layer blocking dielectric 1314 is formed from at least two different materials and has an abrupt interface between first dielectric layer 1314a and second dielectric layer 1314b, as depicted in FIG. 13D.

As described above, either or both of the first dielectric layer 1314a and the second dielectric layer 1314b may comprise an oxide, nitride, oxynitride or a high K dielectric formed by any technique, composed of any materials, and have any thicknesses as described above in association with first dielectric layer 506 and second dielectric layer 508, respectively, from FIG. 5.

In other embodiments (not shown), the blocking dielectric is fabricated to be or include a graded blocking dielectric layer, such as graded blocking dielectric layer 930, shown in FIG. 9C. As with the embodiments described above, the graded blocking dielectric layer is formed directly on the sidewall of opening of 1312. The graded blocking dielectric layer may have a low-to-high gradient in the direction from the outer charge-trapping region 1316 to an outer surface of the blocking dielectric 1316. The graded blocking dielectric layer may be formed by any technique, composed of any materials, and have any thicknesses described in association with graded blocking dielectric layers 604C and 804C, respectively, from FIGS. 6 and 8. As with the multi-layer embodiment described above, either or both of the materials of the first second dielectric layers may comprise a high K dielectric formed by any suitable technique, and having any thicknesses.

In some embodiments, such as that shown in FIG. 13D, the charge-trapping region 1316 can be a split charge-trapping region. The charge-trapping region 1316 can include at least a first charge-trapping layer 1316a closer to the tunnel oxide 1318, and a second charge-trapping layer 1316b overlying the first charge-trapping layer. Generally, the second charge-trapping layer comprises a silicon-rich, oxygen-lean nitride layer and comprises a majority of a charge traps distributed in multiple charge-trapping layers, while the first charge-trapping layer comprises an oxygen-rich nitride or silicon oxynitride, and is oxygen-rich relative to the second charge-trapping layer to reduce the number of charge traps therein. In some embodiments, the split charge-trapping region 1316 further includes at least one thin, intermediate or anti-tunneling layer 1316c comprising a dielectric, such as an oxide, separating the second charge-trapping layer 1316b from the first charge-trapping layer 1316a.

Next, a second or channel opening 1320 is anisotropically etched through tunneling oxide 1318, charge-trapping region 1316, and blocking dielectric 1314, FIG. 13E. Referring to FIG. 13F, a semiconducting material 1322 is deposited in the channel opening to form a vertical channel 1324 therein. The vertical channel 1324 can include an annular region in an outer layer of a substantially solid cylinder of semiconducting material, or, as shown in FIG. 13F, can include a separate, layer semiconducting material 1322 surrounding a cylinder of dielectric filler material 1326.

Figure 13G:
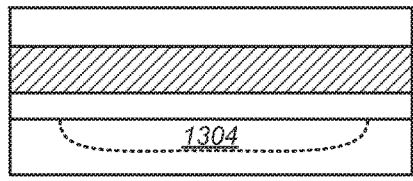
Figure 13G:
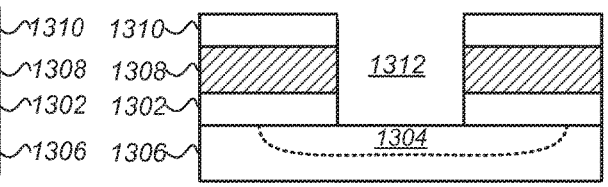
Figure 13G:
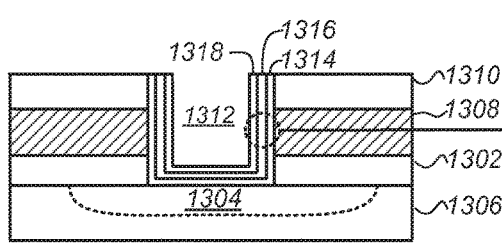
Figure 13G:
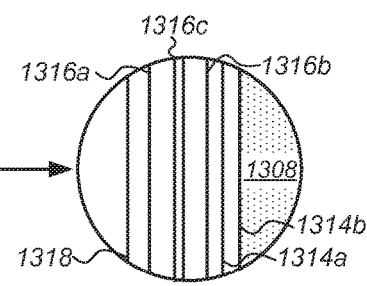
Figure 13G:
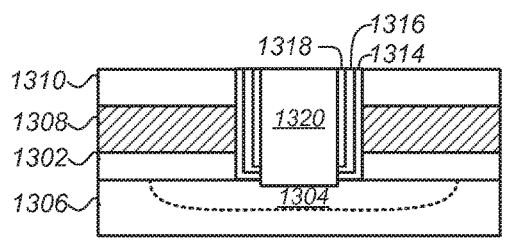
Figure 13G:
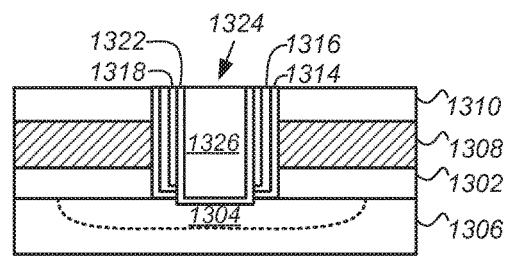
Figure 13G:
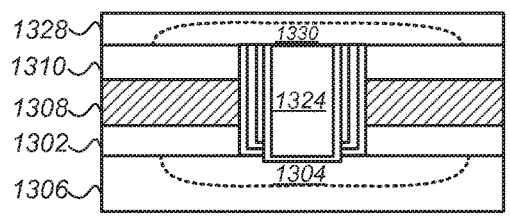

Referring to FIG. 13G, the surface of the upper dielectric layer 1310 is planarized and a layer of semiconducting material 1328 including a second, doped diffusion region 1330, such as a source or a drain, formed therein deposited over the upper dielectric layer to form the device shown.

Referring to FIG. 14A, in a gate last scheme a dielectric layer 1402, such as an oxide, is formed over a sacrificial layer 1404 on a surface on a substrate 1406, an opening etched through the dielectric and sacrificial layers and a vertical channel 1408 formed therein. As with embodiments described above, the vertical channel 1408 can include an annular region in an outer layer of a substantially solid cylinder of semiconducting material 1410, such as polycrystalline or monocrystalline silicon, or can include a separate, layer semiconducting material surrounding a cylinder of dielectric filler material (not shown). The dielectric layer 1402 can comprise any suitable dielectric material, such as a silicon oxide, capable of electrically isolating the subsequently formed gate layer of the memory device 1200 from an overlying electrically active layer or another memory device. The sacrificial layer 1404 can comprise any suitable material that can be etched or removed with high selectivity relative to the material of the dielectric layer 1402, substrate 1406 and vertical channel 1408.

Referring to FIG. 14B, a second opening 1412 is etched through the etched through the dielectric and sacrificial layers 1402, 1404, to the substrate 1206, and the sacrificial layer 1404 etched or removed. The sacrificial layer 1404 can comprise any suitable material that can be etched or removed with high selectivity relative to the material of the dielectric layer 1402, substrate 1406 and vertical channel 1408. In one embodiment the sacrificial layer 1404 comprises Silicon dioxide that can be removed by a buffered oxide (BOE) etch.

Referring to FIGS. 14C and 14D, layers of a tunneling oxide 1414, charge-trapping region, and blocking dielectric are sequentially deposited in the opening and the surface of the dielectric layer 1402 planarize to yield the intermediate structure shown in FIG. 14C. In some embodiments, such as that shown in FIG. 14D, the charge-trapping region can be a split charge-trapping region including at least a first or inner charge trapping layer 1416a closest to the tunnel oxide 1414, and a second or outer charge trapping layer 1416b. Optionally, the first and second charge trapping layers can be separated by an intermediate oxide or anti-tunneling layer 1416c.

The blocking dielectric can comprise a multi-layer blocking dielectric region abutting the outer charge-trapping layer 1416b. In the embodiment shown the multi-layer blocking dielectric is a bi-layer blocking dielectric and includes a first dielectric layer 1418a formed on the sidewall of opening of 1312 and a second dielectric layer 1418b formed above first dielectric layer. First dielectric layer 1418a and second dielectric layer 1418b may be formed by any technique, composed of any materials, and have any thicknesses described above in association with first dielectric layer 918a and second dielectric layer 918b, respectively. Generally, the multi-layer blocking dielectric is formed from at least two different materials and has an abrupt interface between first dielectric layer 1418a and second dielectric layer 1418b, as depicted in FIG. 14D.

As described above, either or both of the first dielectric layer 1418a and the second dielectric layer 1418b may comprise an oxide, nitride, oxynitride or a high K dielectric formed by any technique, composed of any materials, and have any thicknesses as described above in association with first dielectric layer 506 and second dielectric layer 508, respectively, from FIG. 5.

In other embodiments (not shown), the blocking dielectric is fabricated to be or include a graded blocking dielectric layer, such as graded blocking dielectric layer 930, shown in FIG. 9C. As with the embodiments described above, the graded blocking dielectric layer may have a low-to-high gradient in the direction from the outer charge-trapping region 1316b to an inner surface of the blocking dielectric. The graded blocking dielectric layer may be formed by any technique, composed of any materials, and have any thicknesses described in association with graded blocking dielectric layers 604C and 804C, respectively, from FIGS. 6 and 8. As with the multi-layer embodiment described above, either or both of the materials of the first second dielectric layers may comprise a high K dielectric formed by any suitable technique, and having any thicknesses.

Next, a gate layer 1422 is deposited into the second opening 1412 and the surface of the upper dielectric layer 1402 planarized to yield the intermediate structure illustrated in FIG. 14E. As with embodiments described above, the gate layer 1422 can comprise a metal deposited or a doped polysilicon. Finally, an opening 1424 is etched through the gate layer 1422 to form control gate of separate memory devices 1426.

Thus, nonvolatile charge trap memory devices have been disclosed. The devices each include a substrate having a channel region and a pair of source and drain regions. A gate stack is above the substrate over the channel region and between the pair of source and drain regions. In accordance with an embodiment of the present invention, the gate stack includes a high dielectric constant blocking region. In one embodiment, the high dielectric constant blocking region is a bi-layer blocking dielectric region. In another embodiment, the high dielectric constant blocking region is a graded blocking dielectric layer.

What is claimed is:

1. A memory transistor, comprising:
   a gate structure;
   a multi-layer blocking layer disposed abutting the gate structure;
   a multi-layer charge trapping layer including a silicon-rich oxy-nitride film disposed abutting the multi-layer blocking layer and an oxygen-rich oxy-nitride film abutting a tunnel dielectric layer, wherein the silicon-rich oxy-nitride film and the oxygen-rich oxy-nitride film are separated by an intermediate oxide layer and the intermediate oxide layer comprises an oxidized portion of the oxygen-rich oxy-nitride film;
   the tunnel dielectric layer disposed abutting the multi-layer charge trapping layer; and
   a channel disposed abutting the tunnel dielectric layer, wherein the channel is positioned between and electrically connecting a first diffusion region and a second diffusion region,
   wherein the multi-layer blocking layer comprises a first dielectric layer including an oxidized portion of the multi-layer charge trapping layer, and a second dielectric layer abutting the first dielectric layer, and wherein the second dielectric layer includes a silicate layer and a second dielectric constant that is greater than a first dielectric constant of the first dielectric layer.

2. The memory transistor of claim 1, wherein the channel, first and second diffusion regions are formed at least partially within a substrate.

3. The memory transistor of claim 1, wherein the channel, first and second diffusion regions are disposed above a substrate.

4. The memory transistor of claim 1, wherein the channel, first and second diffusion regions are suspended above a substrate.

5. The memory transistor of claim 1, wherein the channel is vertical and oriented substantially perpendicular to a substrate.

6. The memory transistor of claim 1, wherein the silicate layer includes hafnium silicate.

7. The memory transistor of claim 1, wherein the silicate layer includes zirconium silicate.

8. The memory transistor of claim 1, wherein the first dielectric constant is in an approximate range of 3.5 to 4.5.

9. The memory transistor of claim 1, wherein the channel includes a nanowire channel.

10. The memory transistor of claim 9, further comprising:
a gate-all-around (GAA) structure wherein the nanowire channel is enclosed on all four sides by the gate structure.

11. The memory transistor of claim 1, wherein the tunnel dielectric layer comprises a high-K dielectric material that is in contact with the multi-layer charge trapping layer.

12. The memory transistor of claim 1, wherein the gate structure includes a polysilicon gate layer doped with a p-type dopant abutting the multi-layer blocking dielectric.

13. A memory device, comprising:
a gate structure including an opening;
a vertical channel disposed at least partially inside the opening; and
a multi-layer blocking layer, a multi-layer charge trapping layer, and a tunnel dielectric layer disposed between the gate structure and the vertical channel,
wherein the multi-layer charge trapping layer includes a silicon-rich oxy-nitride film disposed abutting the multi-layer blocking layer and an oxygen-rich oxy-nitride film abutting the tunnel dielectric layer, wherein the silicon-rich oxy-nitride film and the oxygen-rich oxy-nitride film are separated by an intermediate oxide layer and the intermediate oxide layer comprises an oxidized portion of the oxygen-rich oxy-nitride film, and
wherein the multi-layer blocking layer is disposed abutting the gate structure, the multi-layer charge trapping layer abutting the multi-layer blocking layer, and the tunnel dielectric layer abutting the multi-layer charge trapping layer, wherein the multi-layer blocking layer comprises a first dielectric layer including an oxidized portion of the multi-layer charge trapping layer, and a second dielectric layer abutting the first dielectric layer, and wherein the second dielectric layer includes a silicate layer and a second dielectric constant that is greater than a first dielectric constant of the first dielectric layer.

14. The memory transistor of claim 13, wherein the vertical channel includes a nanowire channel.

15. The memory transistor of claim 13, wherein the tunnel dielectric layer comprises a high-K dielectric material that is in contact with the multi-layer charge trapping layer.

16. A memory device, comprising:
a vertical channel extending from a first diffusion region formed on a surface on a substrate to a second diffusion region formed over the surface of the substrate, the vertical channel electrically connecting the first diffusion region to the second diffusion region;
a tunnel oxide layer abutting at least a portion of the vertical channel;
a split charge-trapping region abutting the tunnel oxide, the split charge-trapping region including a first charge-trapping layer comprising an oxygen-rich oxy-nitride layer closer to the tunnel oxide layer, and a second charge-trapping layer comprising a silicon-rich oxy-nitride layer overlying the first charge trapping layer, wherein the silicon-rich oxy-nitride film, the oxygen-rich oxy-nitride film are separated by an intermediate oxide layer, and the intermediate oxide layer comprises an oxidized portion of the oxygen-rich oxy-nitride film; and
a multi-layer blocking dielectric layer abutting the split charge-trapping region, the multi-layer blocking dielectric layer comprising at least an oxide layer and a high-K dielectric layer.

17. The memory device of claim 16, wherein the high-K dielectric layer is disposed abutting the oxide layer of the multi-layer blocking dielectric layer, and wherein the high-K dielectric layer includes at least one of hafnium silicate and zirconium silicate, wherein the oxide layer includes a first dielectric constant that is in an approximate range of 3.5 to 4.5, and wherein the high-K dielectric layer includes a second dielectric constant that is greater than the first dielectric constant.

18. The memory device of claim 17, wherein a dielectric constant of the multi-layer blocking dielectric layer includes a low-to-high gradient in a direction from the split charge-trapping layer to a gate layer.

* * * * *